US012622336B2

(12) United States Patent
Lefevre et al.

(10) Patent No.: US 12,622,336 B2
(45) Date of Patent: May 5, 2026

(54) BONDING LAYER AND PROCESS

(71) Applicant: Tokyo Electron Limited, Tokyo (JP)

(72) Inventors: Scott Lefevre, Albany, NY (US); Adam Gildea, Albany, NY (US); Satohiko Hoshino, Koshi City (JP); Sophia Madelone, Albany, NY (US); Yuji Mimura, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 417 days.

(21) Appl. No.: 18/320,781

(22) Filed: May 19, 2023

(65) Prior Publication Data

US 2024/0170444 A1    May 23, 2024

Related U.S. Application Data

(60) Provisional application No. 63/426,140, filed on Nov. 17, 2022.

(51) Int. Cl.
H01L 23/48      (2006.01)
H01L 23/00      (2006.01)
(Continued)

(52) U.S. Cl.
CPC .............. H01L 24/80 (2013.01); H01L 24/08 (2013.01); H01L 2224/08145 (2013.01);
(Continued)

(58) Field of Classification Search
CPC ..................... H01L 24/80; H01L 24/08; H01L 2224/08145; H01L 2224/8022; H01L 2224/80379; H01L 2224/80895; H01L 2224/80896; H01L 24/73; H01L 24/13;

H01L 2224/73204; H01L 2224/83855; H01L 25/0753; H01L 2224/0401; H01L 2224/32145; H01L 2224/81203; H01L 2224/73104; H01L 25/0657; H01L 21/76251; H01L 2224/16145; H01L 2224/04105; H01L 2224/83203; H01L 21/76275; H01L 24/05; H01L 2224/16238;
(Continued)

(56) References Cited

U.S. PATENT DOCUMENTS 9,941,241 B2    4/2018  Edelstein et al.
10,796,913 B2    10/2020  Lin
(Continued)

FOREIGN PATENT DOCUMENTS

KR    1020180086013  A    7/2018

OTHER PUBLICATIONS

International Search Report and Written Opinion on PCT App. PCT/US2023/029505 dated Nov. 22, 2023 (11 pages).

*Primary Examiner* — Niki H Nguyen
(74) *Attorney, Agent, or Firm* — Foley & Lardner LLP

(57)      ABSTRACT

A method includes providing a first bonding surface on a first substrate, the first bonding surface including a bonding layer that is thermally curable or photocurable. The method includes providing a second bonding surface on a second substrate. The method includes bonding the first substrate to the second substrate by making physical contact between the first bonding surface and second bonding surface. The method further includes applying thermal energy or light to the bonding layer.

19 Claims, 25 Drawing Sheets

(51) Int. Cl.
 *H01L 23/52* (2006.01)
 *H01L 29/40* (2006.01)

(52) U.S. Cl.
 CPC ................. *H01L 2224/8022* (2013.01); *H01L 2224/80379* (2013.01); *H01L 2224/80895* (2013.01); *H01L 2224/80896* (2013.01)

(58) Field of Classification Search
 CPC .......... H01L 25/0655; H01L 2224/838; H01L 24/06; H01L 23/49811; H01L 21/2007; H01L 2224/83894; H01L 2224/85205; H01L 23/296; H01L 2924/0002; H01L 23/29; H01L 21/0273; H01L 2224/0812; H01L 2924/00; H01L 21/187; H01L 2224/29109; H01L 2224/29147; H01L 2224/29166; H01L 2224/29184; H01L 2224/29186; H01L 2224/2919; H01L 2224/32225; H01L 2224/32235; H01L 2224/32245; H01L 2224/83191; H01L 2224/83895; H01L 2224/83896; H01L 23/34; H01L 23/3738; H01L 23/473; H01L 23/481; H01L 24/29; H01L 24/32; H01L 24/83; H01L 2224/04026; H01L 23/3733; H01L 2924/054
 See application file for complete search history.

(56) References Cited

U.S. PATENT DOCUMENTS

2018/0047619 A1    2/2018  Lehnert et al.
2022/0352001 A1* 11/2022  Muto ..................... B32B 37/18

* cited by examiner

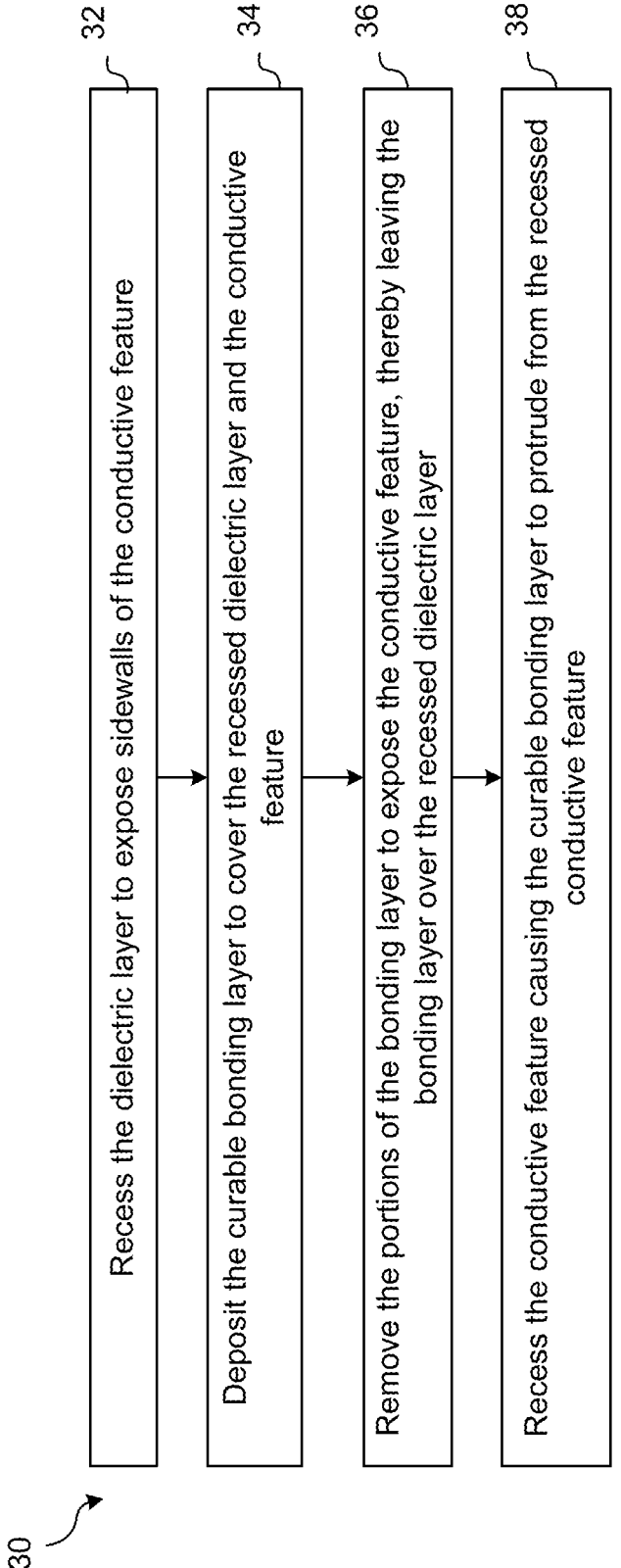

30

32 — Recess the dielectric layer to expose sidewalls of the conductive feature

34 — Deposit the curable bonding layer to cover the recessed dielectric layer and the conductive feature 36 — Remove the portions of the bonding layer to expose the conductive feature, thereby leaving the bonding layer over the recessed dielectric layer 38 — Recess the conductive feature causing the curable bonding layer to protrude from the recessed conductive feature

Selectively deposit the bonding layer over the dielectric layer such that the conductive feature is exposed at the surface

54

Recess the conductive feature causing the curable bonding layer to protrude from the recessed conductive feature

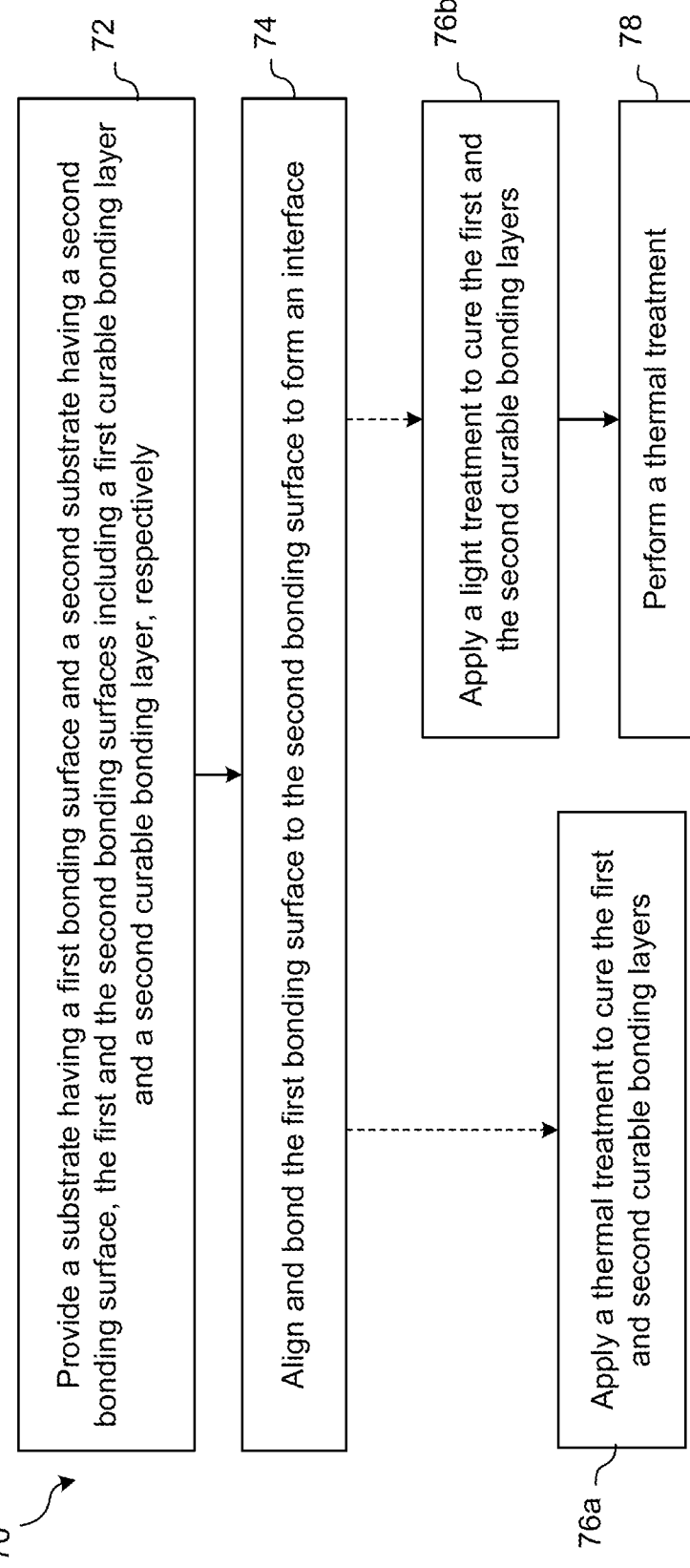

Provide a substrate having a first bonding surface and a second substrate having a second bonding surface, the first and the second bonding surfaces including a first curable bonding layer and a second curable bonding layer, respectively 72

Align and bond the first bonding surface to the second bonding surface to form an interface 74

Apply a light treatment to cure the first and the second curable bonding layers 76b Perform a thermal treatment 78

Apply a thermal treatment to cure the first and second curable bonding layers 76a

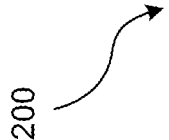
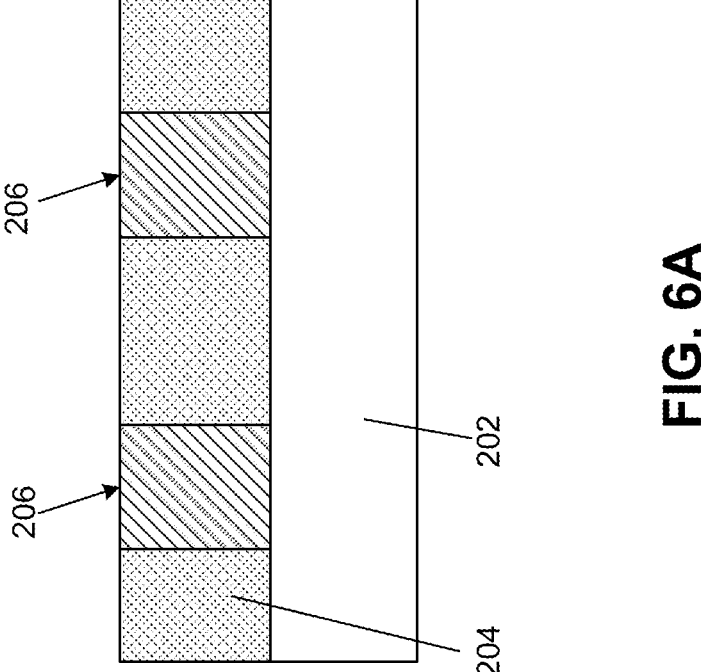
FIG. 6A

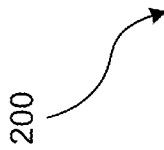
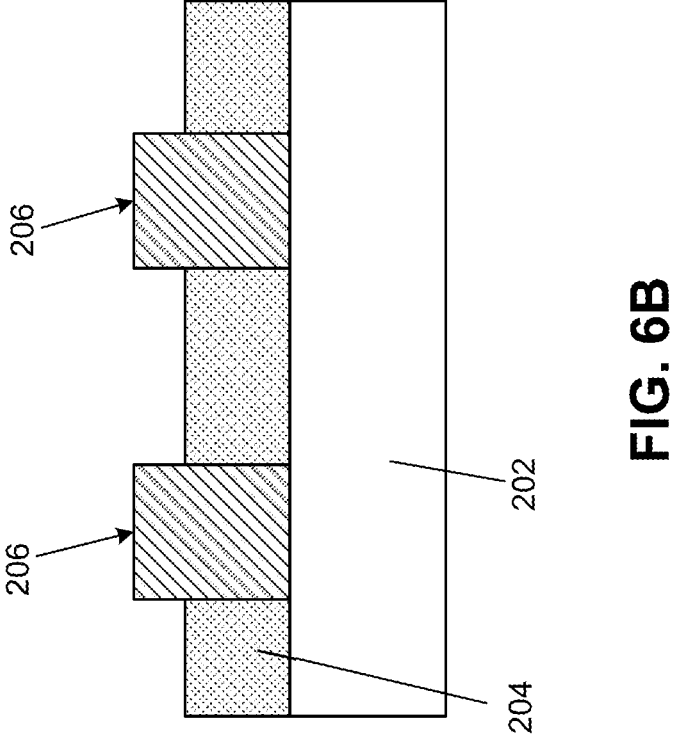
FIG. 6B

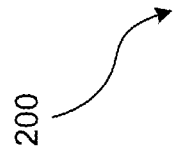
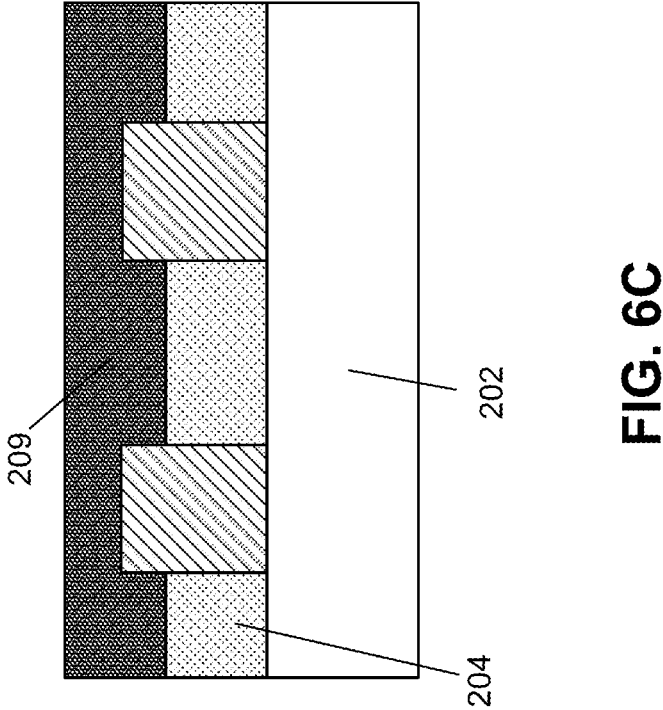
FIG. 6C

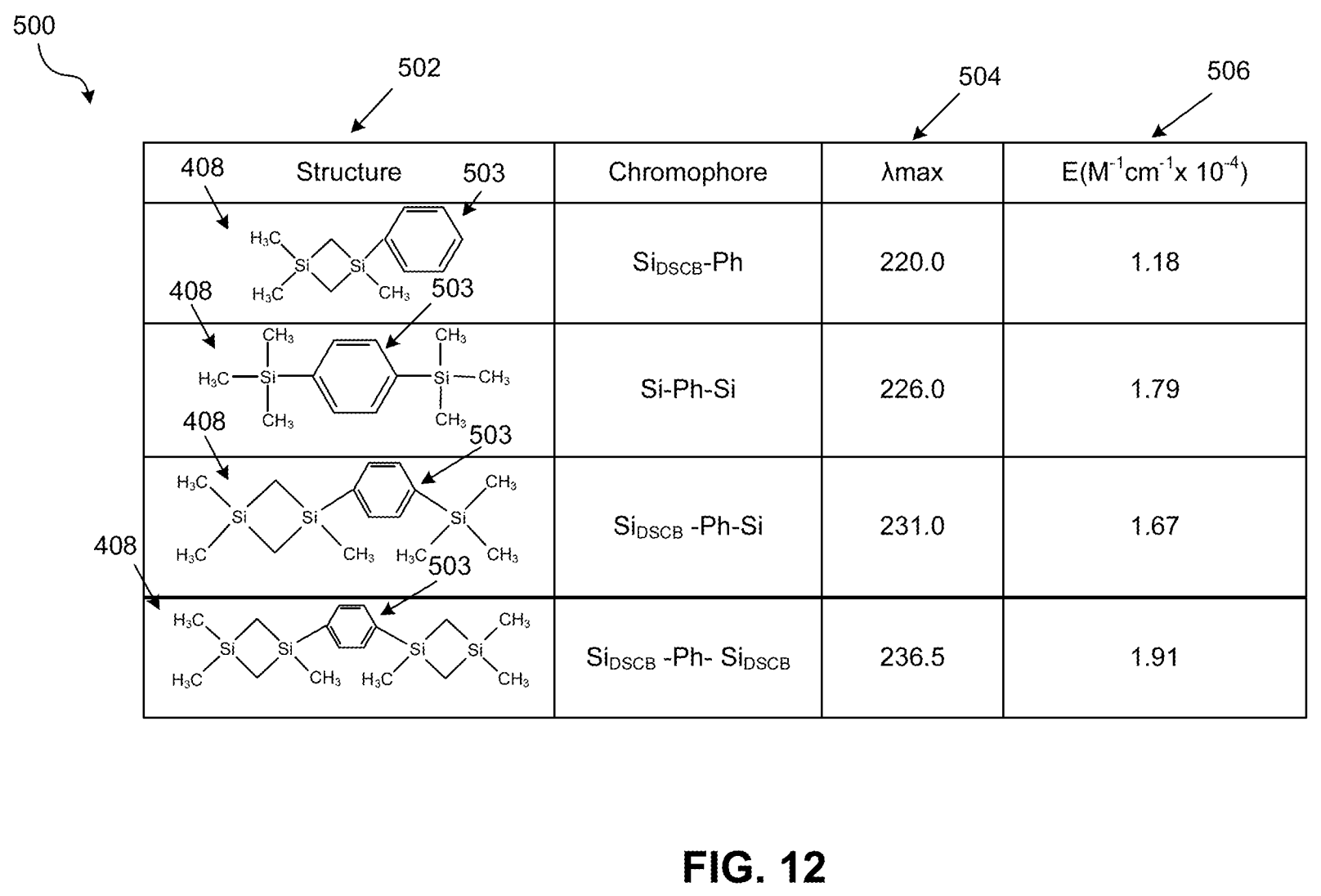

| Structure 502 | Chromophore | λmax 504 | $E(M^{-1} cm^{-1} \times 10^{-4})$ 506 |
|---|---|---|---|
| | $Si_{DSCB}$-Ph | 220.0 | 1.18 |
| | Si-Ph-Si | 226.0 | 1.79 |
| | $Si_{DSCB}$-Ph-Si | 231.0 | 1.67 |
| | $Si_{DSCB}$-Ph-$Si_{DSCB}$ | 236.5 | 1.91 |

FIG. 12

BONDING LAYER AND PROCESS

CROSS-REFERENCE TO RELATED APPLICATION

The present application claims priority to U.S. Provisional Application No. 63/426,140, filed on Nov. 17, 2022, and titled "BONDING LAYER AND PROCESS," the entire disclosure of which is incorporated herein by reference for all purposes.

FIELD OF THE DISCLOSURE

This disclosure relates to methods of semiconductor manufacturing and more particularly to the bonding of multiple semiconductor substrates.

BACKGROUND

Wafer-to-wafer, chip-to-chip, and chip to wafer bonding (generally, substrate bonding) is being implemented to continue Power-Performance-Area-Cost (PPAC) scaling for complex circuits such as are implemented in Systems on Chip (SOCs). Many bonding techniques, such as direct and hybrid bonding, often utilize high pressure and/or temperature to achieve reliable oxide-to-oxide bonding adhesion between the substrates. Lower temperature bonding technologies with excellent adhesion are desired.

FIG. 1 illustrates some of the steps of a conventional process for bonding two semiconductor substrates (e.g., wafers) to form a semiconductor structure 100, though the process is abbreviated and simplified here as it is well known and merely for illustration purposes. A semiconductor substrate 101 includes a base substrate 102 and a plurality of active devices, metallization, and other circuitry features disposed within and/or over the base substrate 102. A dielectric layer 104 is formed over the base substrate 102. The conductive feature 106 may include copper (Cu). The conductive features 106 are formed at or below a bonding surface 108 of the dielectric layer 104. The bonding surface 108 is configured to engage and bond with another bonding surface 108 disposed over a different semiconductor substrate 101 to form the semiconductor structure 100. The dielectric layer 104 may include an oxide, a nitride, a carbide, the like, or combinations thereof, as is well known and described elsewhere. The conductive features 106 are often recessed to below the bonding surface 108 to ensure that, when two bonding surfaces are brought together, a strongly bonded dielectric-to-dielectric interface is formed prior to the conductive features 106 protruding and contacting each other across a bonding interface 110 therebetween. Referring to FIG. 1A, the bonding surface(s) 108 are activated using a plasma (e.g. such as an $N_2$ plasma and/or an $O_2$ plasma) to prepare the surfaces for bonding. Referring to FIG. 1B, hydration is often provided to further enhance the bonding capabilities of the bonding surface(s) 108. Referring to FIG. 1C, the bonding surfaces 108 of two semiconductor substrates 101 are aligned and brought into contact at the bonding interface 110. An anneal step, as shown in FIG. 1D, may improve the dielectric-to-dielectric bond and/or causes the conductive contacts to expand toward each other and create a physical and electrical contact as part of the semiconductor structure 100. One or both substrates may be thinned (not shown) as needed for a given application.

The existing bonding process can be complex and expensive to perform. Creating Si—O linkages (between two opposing dielectric layers) at the bonding interface may rely on the implementation of plasma activation as described in FIG. 1A, followed by treatment with water as described in FIG. 1B. In some instances, such treatment processes may suffer from queue time lag limitations. Moreover, the bonding interface may exhibit limited bonding strength and may be reversible using certain techniques, such as inserting a blade at the bonding interface. In some instances, the bonding strength may be weakened due to environment or processing issues. The hydration step (as shown in FIG. 1B) may also be problematic in that it may cause oxidation of copper-based conductive features, which increases their resistivity. Thus, alternative procedures for implementing a direct or hybrid bonding process without relying on activation and hydration processes are desired.

SUMMARY

Described herein are structures and techniques that provide for improved bonding (e.g., hybrid bonding) between substrates. According to one implementation, a direct covalent bond is formed between two surfaces either via thermal or UV activation with the option of omitting surface treatment (e.g., plasma activation and/or treatment with water), thereby reducing queue time requirement during fabrication process.

In one aspect, the present disclosure provides a method that includes providing a first bonding surface on a first substrate, the first bonding surface including a bonding layer that is thermally curable or photocurable. The method includes providing a second bonding surface on a second substrate. The method includes bonding the first substrate to the second substrate by making physical contact between the first bonding surface and second bonding surface. The method further includes applying thermal energy or light to the bonding layer.

In some implementations, recessing a top portion of the conductive feature such that the bonding layer protrudes from the recessed conductive feature, wherein applying thermal energy causes the recessed conductive feature to expand toward the second bonding surface.

In some implementations, the bonding layer is a first bonding layer, wherein the second bonding surface includes a second bonding layer that is thermally curable or photocurable.

In some implementations, applying light includes implementing UV radiation at a wavelength of about 210 nm to about 260 nm.

In some implementations, applying thermal energy or light covalently bonds the bonding layer to the first substrate at the first bonding surface and to the second substrate at the second bonding surface, respectively.

In some implementations, the bonding layer includes a precursor molecule having a silicon-containing ring structure. In some implementations, the bonding layer includes disilacyclobutanes (DSCB).

In some implementations, the first substrate includes a conductive feature disposed in a dielectric layer such that providing the first bonding surface includes depositing a bonding layer over the first substrate. The providing the first bonding surface further includes removing a portion of the bonding layer to expose the conductive feature such that the first bonding surface includes the conductive feature and a remaining portion of the bonding layer.

In another aspect, the present disclosure provides a method that includes providing a first bonding surface on a first substrate, the first bonding surface including a first bonding layer that is thermally curable or photocurable. The method includes providing a second bonding surface on a second substrate, the second bonding surface including a second bonding layer. The method includes bonding the first substrate to the second substrate by making physical contact between the first bonding layer and the second bonding layer. The method further includes applying thermal energy or light to the first bonding layer and the second bonding layer.

In some implementations, the second bonding layer is thermally curable or photocurable.

In some implementations, the first bonding layer is thermally curable such that applying thermal energy is implemented at a temperature at least about 250° C.

In some implementations, the first bonding layer is photocurable and the method further includes performing an annealing process after applying light. In some implementations, applying light includes implementing UV radiation at a wavelength of about 210 nm to about 260 nm.

In some implementations, applying thermal energy or light includes forming first covalent bonds at a first interface between the first bonding layer and the first substrate. Applying thermal energy or light includes forming second covalent bonds at a second interface between the second bonding layer and the second substrate. Applying thermal energy or light further includes forming third covalent bonds at a third interface between the first bonding layer and the second bonding layer. In some implementations, at least one of the first, the second, and the third covalent bonds include a carbosilane linkage.

In some implementations, the first bonding layer includes a precursor molecule having a silicon-containing ring structure. In some implementations, the silicon-containing ring structure is coupled to an aryl group.

In another aspect, the present disclosure provides a semiconductor structure that includes a first substrate. The semiconductor structure includes a second substrate. The semiconductor structure further includes a bonding layer bonding the first substrate to the second substrate, the bonding layer having a polymer-based material that includes carbosilane linkages. In some implementations, the bonding layer includes disilacyclobutanes (DSCB).

According to one implementation, a curable bonding layer (e.g., curable bonding agent) is formed on the dielectric layer and then activated thermally or by UV exposure at or just before the time of bonding. In some implementations, an etching step and/or polishing (e.g., chemical mechanical polishing/planarization or CMP) step ensure a top surface of a conductive feature is free, or substantially free, from the curable bonding layer. The curable bonding layer may be thermally curable or photocurable. As one example, a curable bonding layer that includes disilacyclobutanes (DSCB) may be used and cured by exposure to certain elevated temperatures and/or light, such as UV light. The curing process occurs due to a ring-opening reaction of the DSCB (e.g., by homolytic cleavage of the Si—C bonds in a ring structure) to form radicals, which then form a network of covalent linkages resulting in the curable bonding layer having ceramic-like properties. The thermodynamic driving force behind the opening of ring structure in DSCB is the appreciable amount of strain in such ring structures.

Bonding according to the methods and using the materials described herein has several advantages. Utilizing the curable bonding layer(s) in a direct or hybrid bonding process creates a bonding interface having non-polar bonds or bonds with lower-polarity (e.g., compared to Si—O bonds typical to bonding interfaces with no curable bonding layers). The bonding of the curable bonding layers relies on a non-reversible or harder-to-reverse reaction, which can conserve bonding sites at the bonding interface due to reverse reaction losses. Using more stable functional groups, queue time effects can be reduced, minimized, or negated. In the present implementations, plasma activation and/or treatment with water may be omitted prior to the bonding process, thus saving time and cost of the overall fabrication process.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 2, 3, 4, and 5 each illustrate a flowchart of an example method of fabricating a semiconductor structure, in accordance with some embodiments.

FIGS. 6A, 6B, 6C, 6D, and 6E each illustrate a cross-sectional side view of an example semiconductor structure at intermediate steps of the method illustrated in one or more of FIGS. 2, 3, 4, and 5, in accordance with some embodiments.

FIG. 12 illustrates a table showing various examples of a photocurable precursor molecule to be implemented according to the schematic reaction of FIGS. 10 and/or 11, in accordance with some embodiments.

DETAILED DESCRIPTION

Figure 1A:
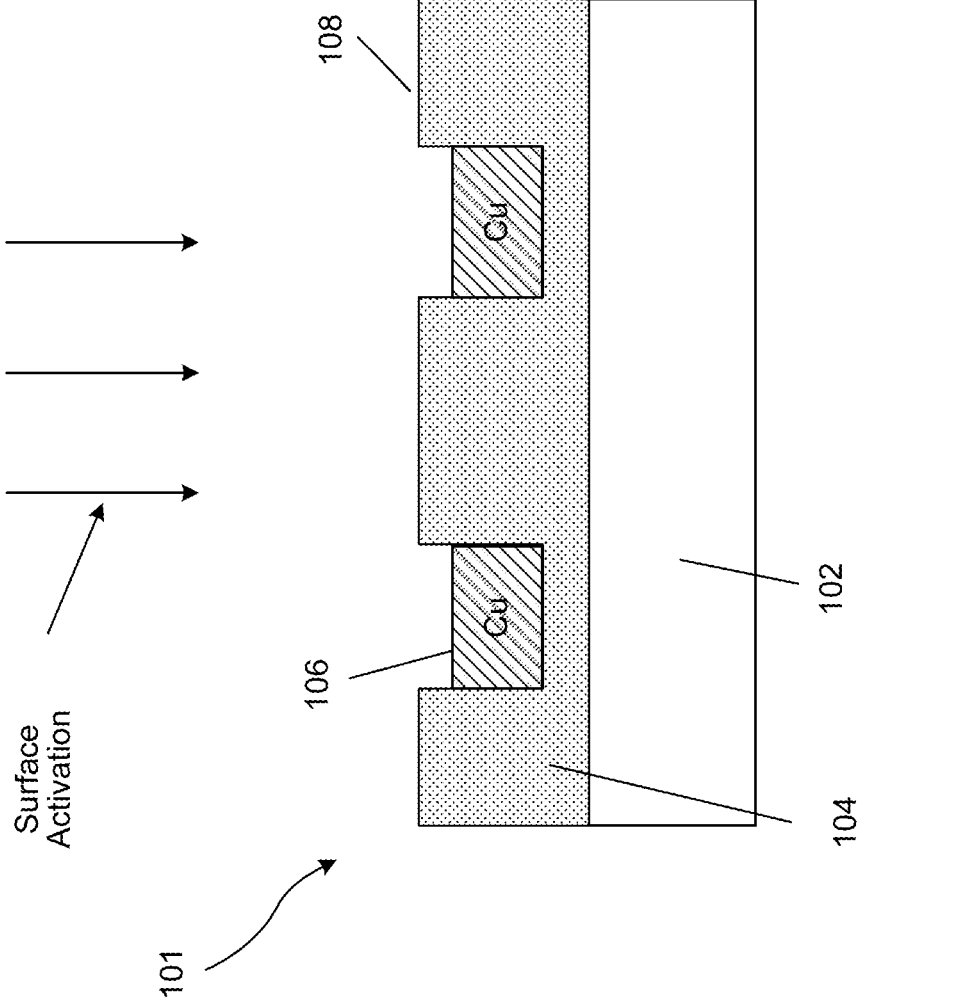
FIGS. 1A, 1B, 1C, and 1D collectively illustrate an example hybrid bonding process according to conventional techniques.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

According to one implementation, a first semiconductor structure (e.g., a first semiconductor substrate, a first semiconductor wafer, a first semiconductor die, etc.) is formed and processed before being bonded to a second semiconductor structure (e.g., a second semiconductor substrate, a second semiconductor wafer, a second semiconductor die, etc.) leading to an improved direct or hybrid bonding technique in fabrication of semiconductor devices. Bonding surfaces of the two semiconductor structures, which each include a conductive feature disposed in or adjacent a dielectric layer, are treated such that a curable bonding layer including a thermally curable (e.g., thermally cross-linkable) material (e.g., disilacyclobutane, or DSCB) or a photocurable (e.g., photo-cross-linkable) material is formed on one or both of the bonding surfaces before bonding. The curable bonding layer may be formed on at least the dielectric layer of each bonding surface.

In the case of hybrid bonding, where the conductive feature and the dielectric layer are both exposed at the bonding surface, the curable bonding layer may be selectively formed on the dielectric layer of each bonding surface or blanket deposited over the entire bonding surface and then thinned to expose the conductive feature using a polishing or etching technique. The bonding layer may be about 1 nm to about 10 nm in thickness. The bonding surfaces are brought together by making physical contact and exposed to a thermal treatment (e.g., application of thermal energy or heat) or a light treatment (e.g., application of UV radiation) to cure or cross-link the bonding layers across the bonding interface between the bonding surfaces. On bonding, the curable material in each curable bonding layer chemically reacts with that of an opposing curable bonding layer across the bonding interface. The light treatment may be performed with UV radiation having a wavelength of about 210 nm to about 260 nm. In some examples, the thermal treatment may be performed at a temperature of at least about 250° C. The thermal treatment may also cause the conductive features to expand across the bonding interface during the bonding process.

By using a chemically driven process for bond formation, temperature of the thermal treatment can be reduced over some conventional bonding techniques. The use of chemical surface treatments can be selectively formed on oxides (e.g., silicon dioxide) or other insulating materials (e.g., silicon carbonitride) in the dielectric layer in order to avoid interference with metal-to-metal contacts used to interconnect the conductive features. The curable bonding layers upon curing may have a relatively low dielectric constant and may impede copper diffusion near the bonding interface. For example, a dielectric constant of about 2.38 to about 2.5 may be achieved and the more non-polar nature of carbosilane —Si—C—Si—C— bonds (compared to siloxane —Si—O—Si—O— bonds) makes the bonding layer less susceptible to copper diffusion.

Figure 2:
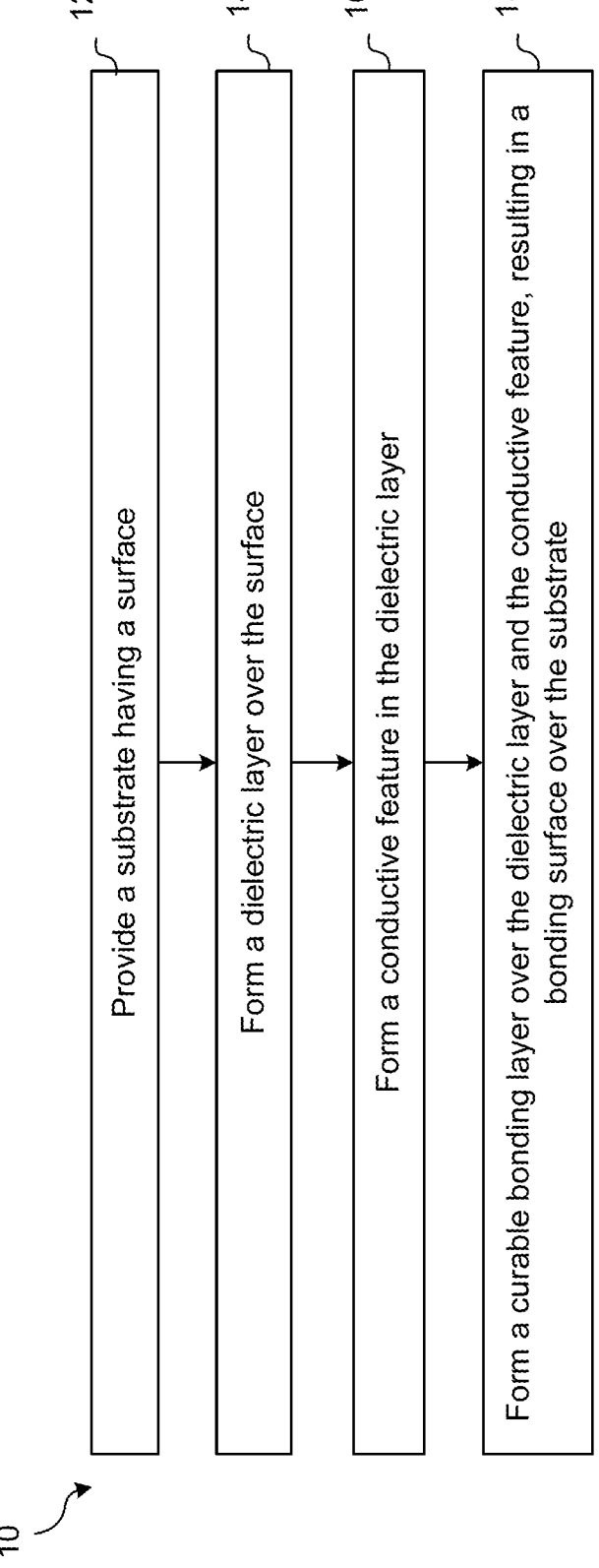
Figure 4:
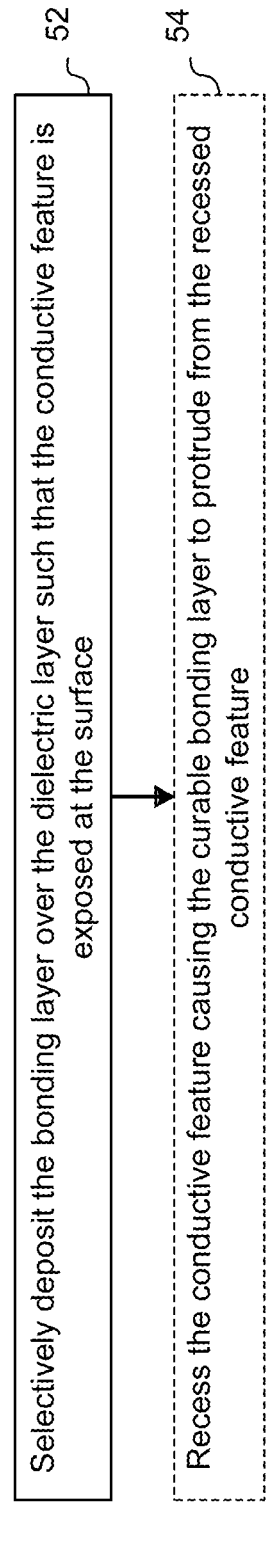

FIG. 2 illustrates a flowchart of an example method 10 for forming a bonding surface over a semiconductor structure, according to some implementations of the present disclosure. FIGS. 3 and 4 illustrate a flowchart of example methods 30 and 50, respectively, for implementing a portion (e.g., one or more operations) of the method 10, according to some implementations of the present disclosure. FIG. 5 illustrates a flowchart of an example method 70 for bonding or coupling bonding surfaces of two semiconductor structures (e.g., two semiconductor substrates, two semiconductor wafers, two semiconductor dies, etc.), according to some implementations of the present disclosure. It is noted that the methods 10, 30, 50, and 70 are merely examples and are not intended to limit the present disclosure. It is further understood that additional operations may be provided before, during, and after the method 10 of FIG. 2, the method 30 of FIG. 3, the method 50 of FIG. 4, and/or the method 70 of FIG. 5, and that some other operations may only be briefly described herein.

In various implementations, operations of the method 10 may be associated with an example semiconductor structure 200 at various fabrication stages, and operations of the method 70 may be associated with an example semiconductor structure 300 or 600 at various fabrication stages, which will be discussed in further detail below. It should be understood that the semiconductor structures 200, 300, and 600 may each include a number of other devices such as inductors, fuses, capacitors, coils, etc., while remaining within the scope of the present disclosure.

Referring to FIGS. 2 and 6A, the method 10 at operation 12 provides the semiconductor structure 200 that includes a semiconductor substrate (e.g., a base substrate) 202.

The semiconductor substrate 202 includes a semiconductor material, such as a bulk semiconductor, a semiconductor-on-insulator (SOI), or the like, which may be doped (e.g., with a p-type or an n-type dopant) or undoped. The semiconductor substrate 202 may be or correspond to a wafer (e.g., 202 or 204), such as a silicon wafer. Generally, an SOI includes a layer of a semiconductor material formed on an insulator layer. The insulator layer may be, for example, a buried oxide (BOX) layer, a silicon oxide layer, or the like. The semiconductor substrate 202 may include other semiconductor materials, such as a multi-layered or gradient semiconductor material. In some examples, the semiconductor substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Subsequently, the method 10 at operation 14 forms a dielectric layer (e.g., insulating layer) 204 on or overlaying the semiconductor substrate 202. In the present implementations, the dielectric layer 204 and the subsequently-formed conductive features in the dielectric layer 204 constitute a bonding surface 214 of the semiconductor structure 200. In some implementations, the bonding surface 214 is over a front side of the semiconductor substrate 202 (e.g., over a surface that includes the device features of the semiconductor structure 200). Alternatively, the bonding surface 214 may be over a back side of the semiconductor substrate 202 (e.g., over a surface opposing the device features of the semiconductor structure 200).

The dielectric layer 204 may include any suitable material, such as an oxide, a nitride, a carbide, the like, or combinations thereof. Non-limiting examples include silicon oxide ($SiO_2$), silicon nitride (SiN), silicon carbonitride (SiCN), a low-k dielectric material (e.g., a dielectric material having a dielectric constant less than that of silicon oxide, which is about 3.9), the like, or combinations thereof. The dielectric layer 204 may be formed or deposited using at least one suitable deposition technique, such as chemical vapor deposition (CVD), flowable CVD (FCVD), atomic layer deposition (ALD), spin coating, the like, or combinations thereof.

Though not depicted separately for the sake of simplicity, the semiconductor structure 200 may include a number of device features (e.g., transistors, diodes, resistors, etc) within and/or over the semiconductor substrate 202 and a number of interconnect structures (alternatively referred to as conductive features, such as vias and conductive lines) formed over the device features. Example transistors may include field-effect transistors (FETs) such as fin-like FET (e.g., FinFET), multi-gate FETs, nanosheet FETs, the like, or combinations thereof. The interconnect structures may be configured to electrically connect the device features to one another so as to form an integrated circuit, which can function as a logic device, a memory device, an input/output device, or the like. The device features may include doped or undoped semiconductor materials, which may be similar in composition as the semiconductor substrate 202.

The interconnect structures may include a conductive material, such as Cu, tungsten (W), nickle (Ni), aluminum (Al), ruthenium (Ru), silver (Ag), gold (Au), platinum (Pt), titanium (Ti), tantalum (Ta), TiN, TaN, the like, or combinations thereof, disposed in a dielectric (e.g., insulating) material, such as oxide, nitride, carbide, the like, or combinations thereof. The device features and the interconnect structures may be formed within intervening dielectric layers (e.g., intermetal dielectric layers, interlevel/interlayer dielectric layers, etch-stop layers, etc.) between the semiconductor substrate 202 and the dielectric layer 204, such as in a front-end-of-line (FEOL) or back-end-of-line (BEOL) layers. The intervening dielectric layers may be similar to the dielectric layer 204 in composition.

Still referring to FIGS. 2 and 6A, the method 10 at operation 16 forms a conductive feature 206 in the dielectric layer 204 to interconnect with one or more underlying conductive features (e.g., metallization layers, interconnect structures, device features, etc.).

The conductive feature 206 may include any suitable conductive material including Cu, W, Ni, Al, ru, Ag, Au, Pt, Ti, Ta, TiN, TaN, the like, or combinations thereof. In the depicted implementations, the conductive feature 206 includes Cu.

In some implementations, forming the conductive feature 206 includes forming a recess (not depicted) in the dielectric layer 204 by performing a patterning process. For example, a patterned mask layer (not depicted) may be formed over the dielectric layer 204 using a suitable lithography technique, where the patterned mask layer is formed with an opening corresponding to a position of the recess, and the dielectric layer 204 may be etched or patterned using the patterned mask layer as an etch mask, resulting in the recess in the dielectric layer 204.

Subsequently, a conductive layer may be deposited as a blanket layer over the semiconductor structure 200 to fill the recess and overlay the top surface of the dielectric layer 204. The conductive layer may be deposited by any suitable deposition technique, such as CVD, ALD, PVD, plating (e.g., electroplating, electroless plating, etc.), the like, or combinations thereof. The blanket layer and any underlying layers may then be etched (e.g., by a dry etching, a reactive ion etching (RIE), or a wet etching process) or polished (e.g., by a chemical-mechanical polishing/planarization, or CMP, process) until the top surface of the dielectric layer 204 is exposed, thereby forming the conductive feature 206 in the dielectric layer 204. The conductive feature 206 may be formed as part of an FEOL process, a middle-end-of-line (MEOL) process, or a BEOL process. For example, the conductive feature 206 may be formed as a bonding pad for coupling the semiconductor structure 200 to another semiconductor structure, die, substrate, or the like as a portion of a package.

Referring to FIG. 2, the method 10 at operation 18 forms a curable bonding layer 209 over the dielectric layer 204 and the conductive feature 206, resulting in the bonding surface 214 over the semiconductor substrate 202. As shown, referring to FIGS. 3 and 6B-6E collectively, operation 18 may be implemented by the method 30.

Referring to FIGS. 3 and 6B, the method 30 at operation 32 recesses the dielectric layer 204 to expose a top portion, including sidewalls, of the conductive feature 206, thereby causing the conductive feature 206 to protrude from a top surface of the recessed dielectric layer 204. The dielectric layer 204 may be recessed by any suitable method. In one example, the dielectric layer 204 may be etched back using a suitable etching process (e.g., a dry etching process, a wet etching process, etc.). In another example, a sacrificial layer may be formed over the dielectric layer 204 before forming the conductive feature 206 (e.g., at operation 14) and then selectively removed after forming the conductive feature 206 (e.g., at operation 16), thereby exposing the top portion of the conductive feature. In yet another example, the conductive feature 206 may be coplanar with or recessed slightly from the top surface of the dielectric layer 204 to accommodate formation of a thin layer of the curable bonding layer 209. In this regard, operation 32 may be omitted.

Referring to FIGS. 3 and 6C, the method 30 at operation 34 deposits the curable bonding layer 209 over the recessed dielectric layer 204 and the conductive feature 206.

In the present implementations, the curable bonding layer (e.g., curable bonding agent) 209 includes a polymer-based material curable by application of external energy. For example, the curable bonding layer 209 includes a thermally curable material, a photocurable material, or a combination thereof. The thermally curable material may be cured or cross-linked when subjected to a thermal or heat treatment at a sufficiently high temperature. The photocurable material may be cured or cross-linked when subjected to a light or radiation treatment. In some implementations, the thermally curable material may be cured at a temperature of at least about 250° C. In some examples, the temperature at which the activation of the curing or cross-linking reaction (e.g., a ring-opening reaction) occurs does not exceed about 400° C. In some implementations, the photocurable material may be curable by application of UV radiation at a wavelength of about 210 nm to about 260 nm. In some implementations, the polymer-based material of the curable bonding layer 209 may be configured to cure or cross-link in response to both thermal energy and light.

Figure 10:
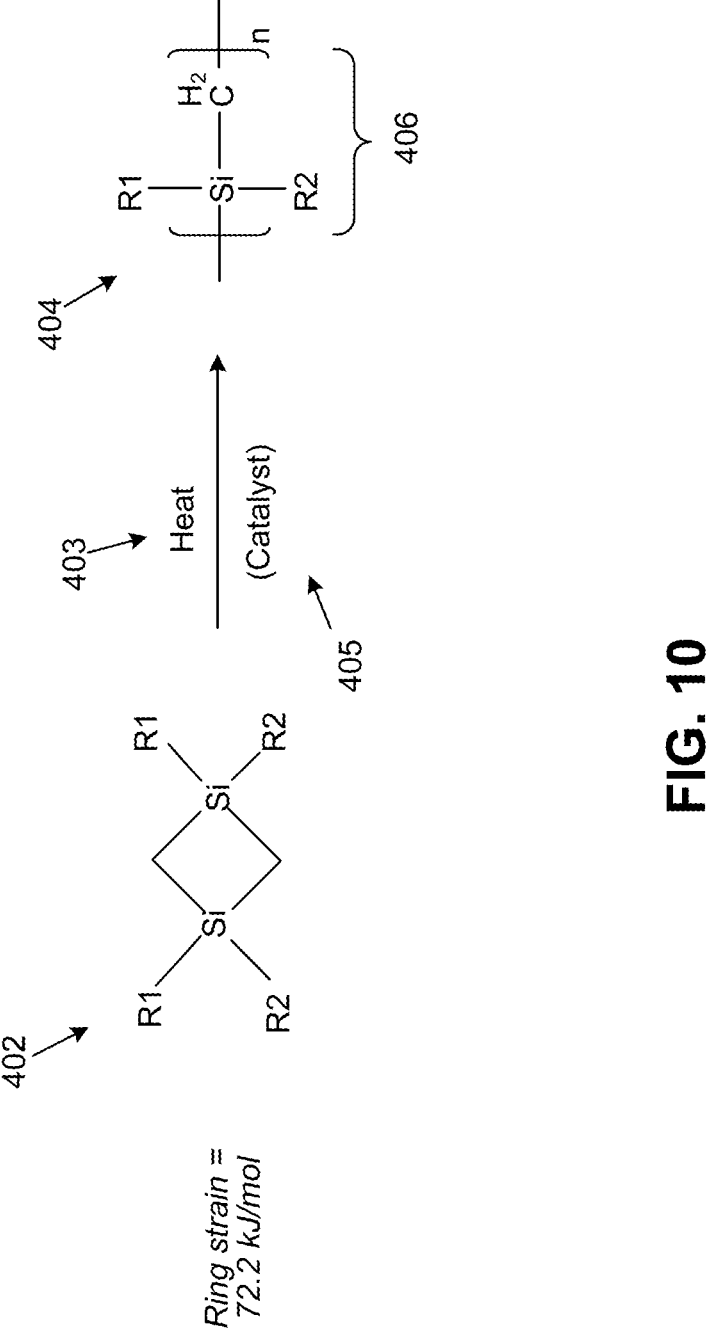
FIG. 10 illustrates a schematic reaction of forming a polymer-based material from a plurality of thermally curable precursor molecules, in accordance with some embodiments.
Figure 11:
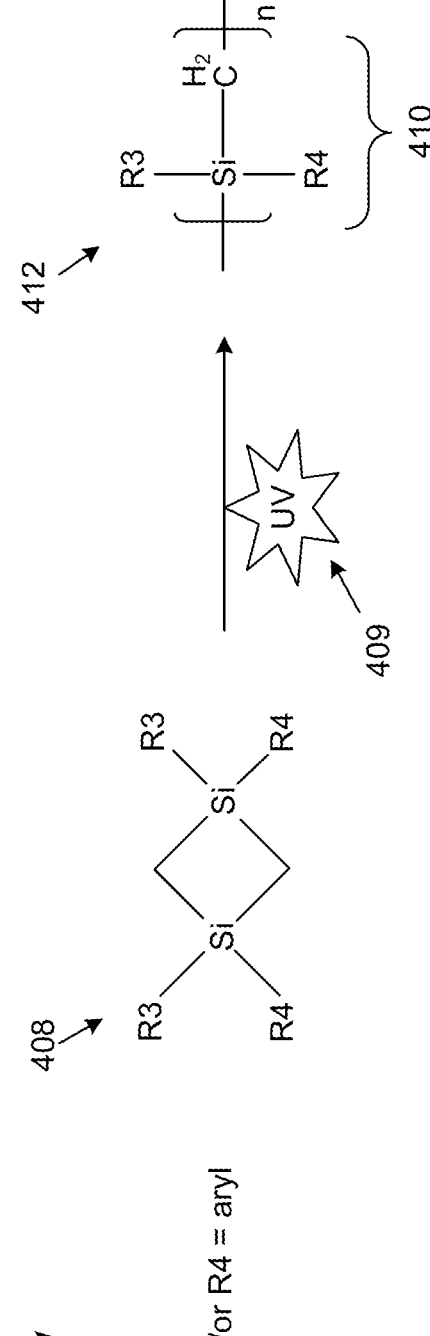
FIG. 11 illustrates a schematic reaction of forming a polymer-based material from a plurality of photocurable precursor molecules, in accordance with some embodiments.

In some implementations, referring to FIGS. 10 and 11, the polymer-based material is formed from a precursor molecule each having a ring structure, where the ring structure exhibits strain energy that drives opening of the ring structure during the subsequent curing or cross-linking reactions. In the present implementations, the ring structure includes one or more silicon (Si) atoms and one or more functional groups, such as the depicted R1, R2, R3, and R4, as side chains coupled to the one or more of the silicon atoms.

Referring to FIG. 10, a schematic reaction 400 illustrating curing or cross-linking of precursor molecules 402 to form a polymer-based material 404 by a thermal treatment 403 is shown. In the present embodiments, the precursor molecule

402 is thermally curable and includes a DSCB-based ring structure with a strain energy at about 72.2 kJ/mol, which is an energy barrier over which the ring-opening reaction is activated. As a non-limiting example, the precursor molecule 402 has a four-member ring structure that includes two Si atoms each coupled to the functional groups R1 and R2. The precursor molecule 402 may include less or more suitable functional groups similar to the functional groups R1 and R2.

In some implementations, the thermal treatment 403 includes a ring-opening reaction and a polymerization (e.g., curing or cross-linking) reaction and occurs when the precursor molecules 402 are heated to at least about 250° C. The ring-opening reaction may cause homolytic cleavage of the Si—C bonds in the precursor molecule 402, which then exhibits free radicals to react with other free radicals and polymerize into the polymer-based material 404. While the ring-opening reaction typically occurs at elevated temperatures, it can occur in conditions as low as room temperature (e.g., about 25° C.) with the aid of various transition metal complex catalysts 405 (e.g., Pt, Pd, Cu, or the like).

As shown in FIG. 10, the polymer-based material 404 includes a plurality of monomers 406 bonded to one another, where the subscript "n" may be any suitable number greater than two (e.g., n>2). The polymer-based material 404 includes at least two carbosilane (—Si—C—Si—C—) bonds (e.g., forming polycarbosilanes) linked together, which may exhibit ceramic-like properties in comparison to siloxane (—Si—O—Si—O—) bonds that are typically found at a bonding interface between $SiO_2$-based dielectric layers, such as the untreated dielectric layer 204. Furthermore, the carbosilane bonds may exhibit reduced polarity (e.g., being non-polar). In some examples, the polymer-based material 404 may be a hydrophobic material with good thermal stability, have a relatively low dielectric constant (e.g., low-k, such as about 2.3 to about 2.4, which is less than that of silicon dioxide), have a relatively higher modulus (e.g., about 7.8 GPa to about 9.15 GPa), and resistant to copper diffusion. In some implementations, the precursor molecule 402 is thermally stable at temperatures greater than about 400° C. In some implementations, the precursor molecule 402 is thermally stable at room temperature defined herein.

In some implementations, the curable bonding layer 209 is deposited as a blanket layer over the dielectric layer 204 and the conductive feature 206, thereby completely covering the exposed top portion of the conductive feature 206. The curable bonding layer 209 may be deposited by any suitable method, such as spin-coating, to form a thickness sufficient to cover a top surface of the conductive feature 206 as shown in FIG. 6C.

Figure 6D:
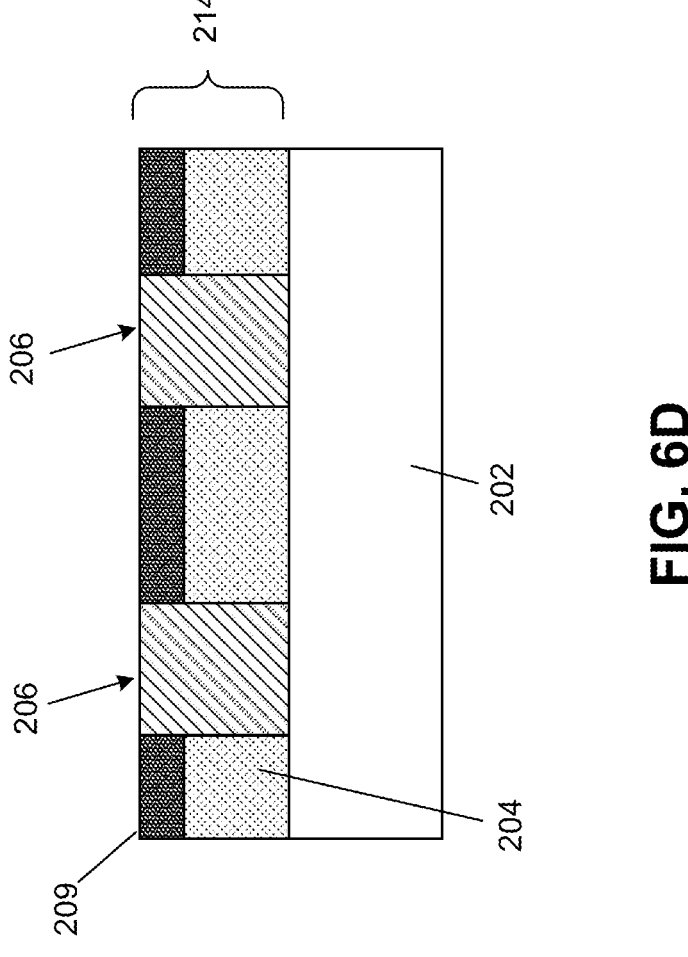

Referring to FIGS. 3 and 6D, the method 30 at operation 36 removes portions of the curable bonding layer 209 to expose the top surface of the conductive feature 206, thereby leaving remaining portions of the curable bonding layer 209 over the dielectric layer 204 and adjacent the conductive feature 206. In some implementations, the remaining portions of the curable bonding layer 209 are substantially coplanar with the conductive feature 206.

In some implementations, the portions of the curable bonding layer 209 are removed by applying a CMP process to planarize the top surface of the conductive feature 206 with a top surface of the curable bonding layer 209. In some implementations, the portions of the curable bonding layer 209 are removed by a suitable etching process (e.g., a dry etching process, a wet etching process, etc.) to expose the top surface of the conductive feature 206.

Figure 6E:
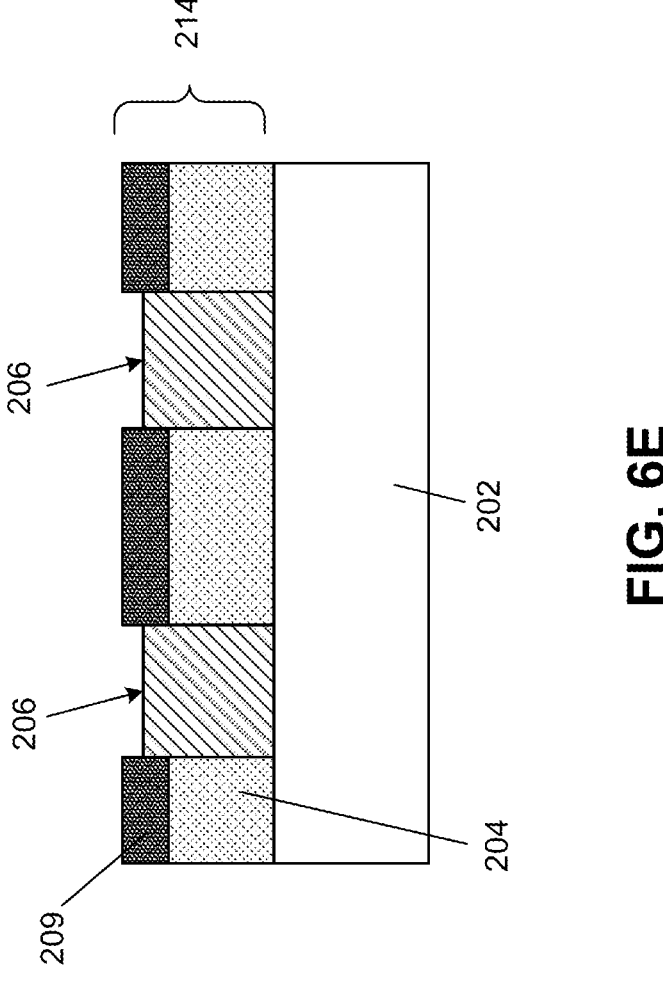

Referring to FIGS. 3 and 6E, the method 30 at operation 38 recesses the conductive feature 206 such that the curable bonding layer 209 protrudes from a top surface of the recessed conductive feature 206, resulting in the bonding surface 214 over the semiconductor substrate 202. The conductive feature 206 may be selectively recessed by a suitable etching process (e.g., a dry etching process, a wet etching process, etc.). In some examples, the conductive feature 206 may be recessed by about 1 nm to about 5 nm. In some implementations, the recessed conductive feature 206 has a top surface that is above the top surface of the dielectric layer 204 but below a top surface of the curable bonding layer 209. In some implementations, recessing the conductive feature 206 creates space over the conductive feature 206 to allow its expansion of across a bonding interface during the subsequent thermal treatment and/or annealing process.

Figure 7A:
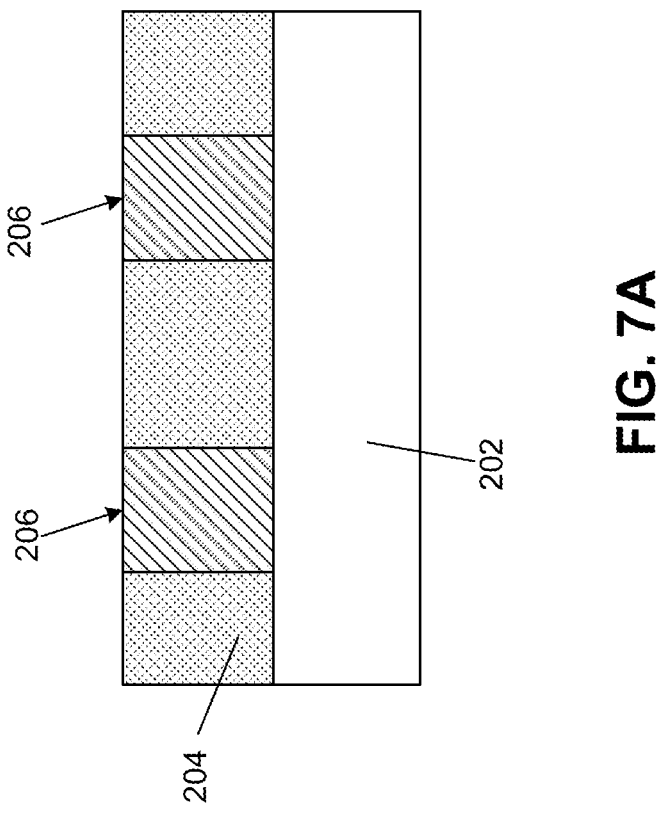
FIGS. 7A and 7B each illustrate a cross-sectional side view of an example semiconductor structure at intermediate steps of the method illustrated in one or more of FIGS. 2, 3, 4, and 5, in accordance with some embodiments.
Figure 7B:
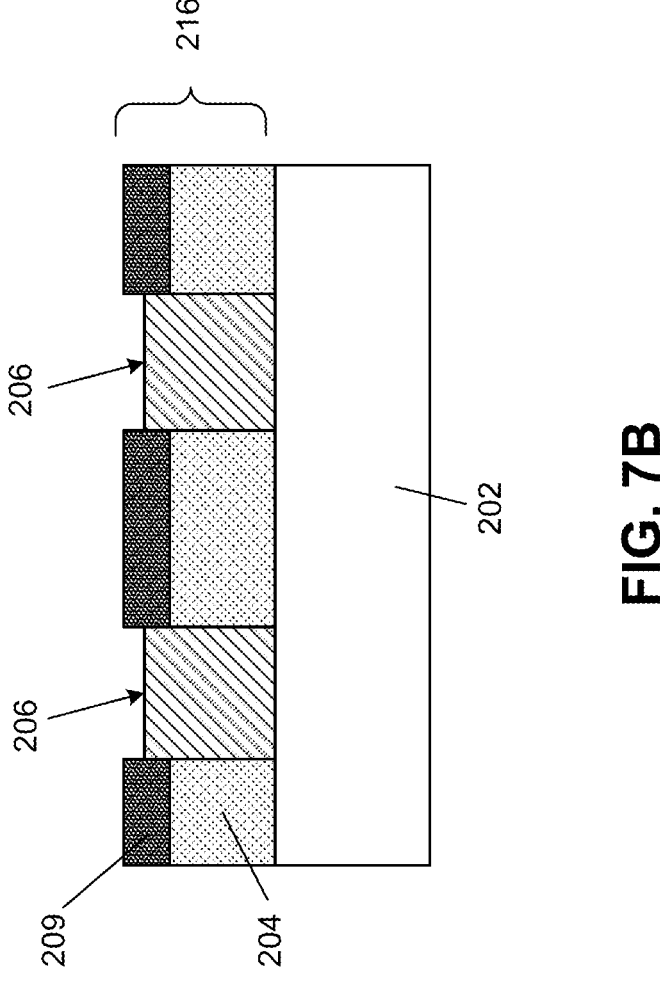

In some implementations, referring to FIGS. 4, 7A, and 7B collectively, operation 18 may be implemented by the method 50 to form a bonding surface 216 similar to the bonding surface 214.

After forming the conductive feature 206 (see FIG. 7A, which is similar to FIG. 6A), the method 50 at operation 52 selectively deposits the curable bonding layer 209 over the dielectric layer 204 to expose the top surface of the conductive feature 206 as shown in FIG. 7B, resulting in the bonding surface 216. In some implementations, the top surface of the conductive feature 206 is below the top surface of the curable bonding layer 209. In some implementations, selectively depositing the curable bonding layer 209 over the dielectric layer 204 includes functionalizing the dielectric layer 204 but not the conductive feature 206 and selectively coupling the curable bonding layer 209 with the functionalized dielectric layer 204. Composition of the functionalization may be dependent on composition of the curable bonding layer 209 and is thus not limited by the present disclosure.

In some implementations, referring to FIG. 4, the method 50 at operation 54 may further recess the conductive feature 206 such that the top surface of the conductive feature 206 is about 1 nm to about 5 nm below the top surface of the curable bonding layer 209. In some implementations, operation 54 is omitted.

Now referring to FIGS. 5 and 8A-9B, the method 70 provides an example process for bonding or coupling one bonding surface of a semiconductor structure with another bonding surface of another semiconductor structure. In the depicted implementations, FIGS. 8A and 8B correspond to an example of the method 70 applied to coupling two bonding surfaces 214, and FIGS. 9A and 9B correspond to an example of the method 70 applied to coupling two bonding surfaces 216.

Figure 8A:
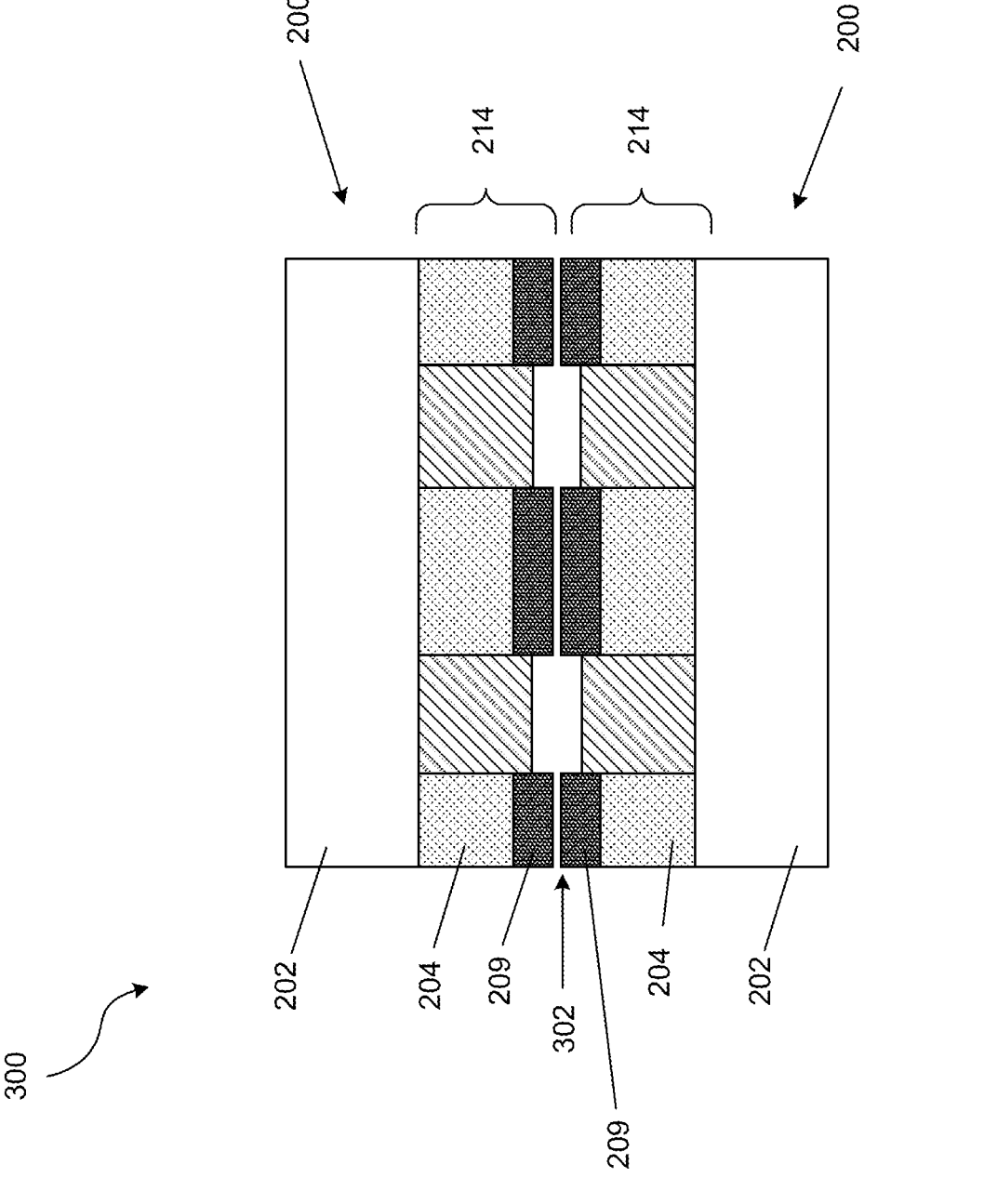
FIGS. 8A and 8B each illustrate a cross-sectional side view of an example semiconductor structure at intermediate steps of the method illustrated in one or more of FIGS. 2, 3, 4, and 5, in accordance with some embodiments.
Figure 9A:
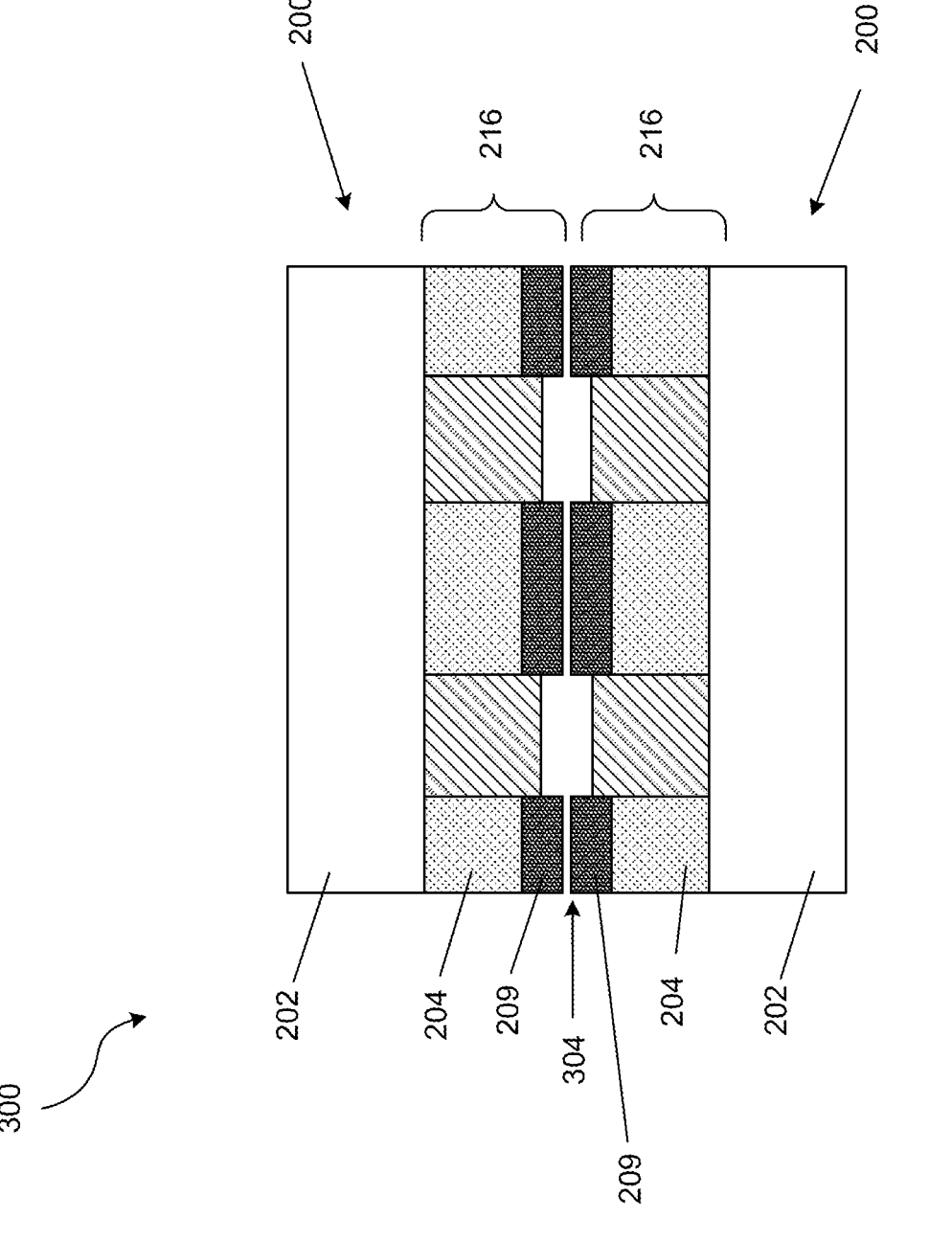
FIGS. 9A and 9B each illustrate a cross-sectional side view of an example semiconductor structure at intermediate steps of the method illustrated in one or more of FIGS. 2, 3, 4, and 5, in accordance with some embodiments.

Referring to FIGS. 5, 8A, and 9A, the method 70 at operation 72 provides two semiconductor structures 200, at least one of which includes the bonding surface 214/216 formed according the methods 10, 30, and/or 50 described herein. For example, each bonding surface 214/216 includes the curable bonding layer 209 over the dielectric layer 204 and the conductive feature 206 disposed in the dielectric layer 204. In some implementations, the curable bonding layer 209 of the opposing bonding surfaces 214/216 may include precursor molecules 402/408 of the same or different compositions.

Subsequently, still referring to FIGS. 5, 8A, and 9A, the method 70 at operation 74 aligns and bonds the two opposing bonding surfaces 214/216 of the respective semiconductor structures 200 to make physical and direct contact therebetween, resulting in a semiconductor structure (e.g., bonded structure) 300. In the present implementations, the physical and direct contact establishes a bonding interface 302/304 between the opposing bonding surfaces 214/216. In some implementations, one of the semiconductor structures 200 is first flipped or inverted (e.g., rotated 180°), such that the two bonding surfaces 214/216 are disposed opposing one another and bonded in a face-to-face configuration during an alignment process.

The bonding surfaces 214/216 may be bonded by any suitable process, such as by a hybrid bonding process. In this regard, the bonding process may be implemented by aligning similar features of the opposing bonding surfaces 214/216 with one another, such that metal-to-metal contact can be formed across the bonding interface 302/304 between the conductive features 206 and dielectric-to-dielectric contact can be formed across the bonding interface 302/304 between the dielectric layers 204.

It should be noted that, although FIGS. 8A-9B each depict two identical but opposing bonding surfaces, the present disclosure does not require such configuration. In one example, one of the bonding surfaces may include the bonding surface 214, and the other one of the bonding surfaces may include the bonding surface 216. In another example, one of the bonding surfaces may include either the bonding surface 214 or the bonding surface 216, and the other one of the bonding surfaces may include features and functions different from those of the bonding surface 214 and 216. For example, the other one of the bonding surfaces may be free of the curable bonding layer 209 such that the curable bonding layer 209 of the one of the bonding surfaces physically and directly contacts the dielectric layer 204 of the other one of the bonding surfaces (e.g., without any curable bonding layer 209).

Figure 1B:
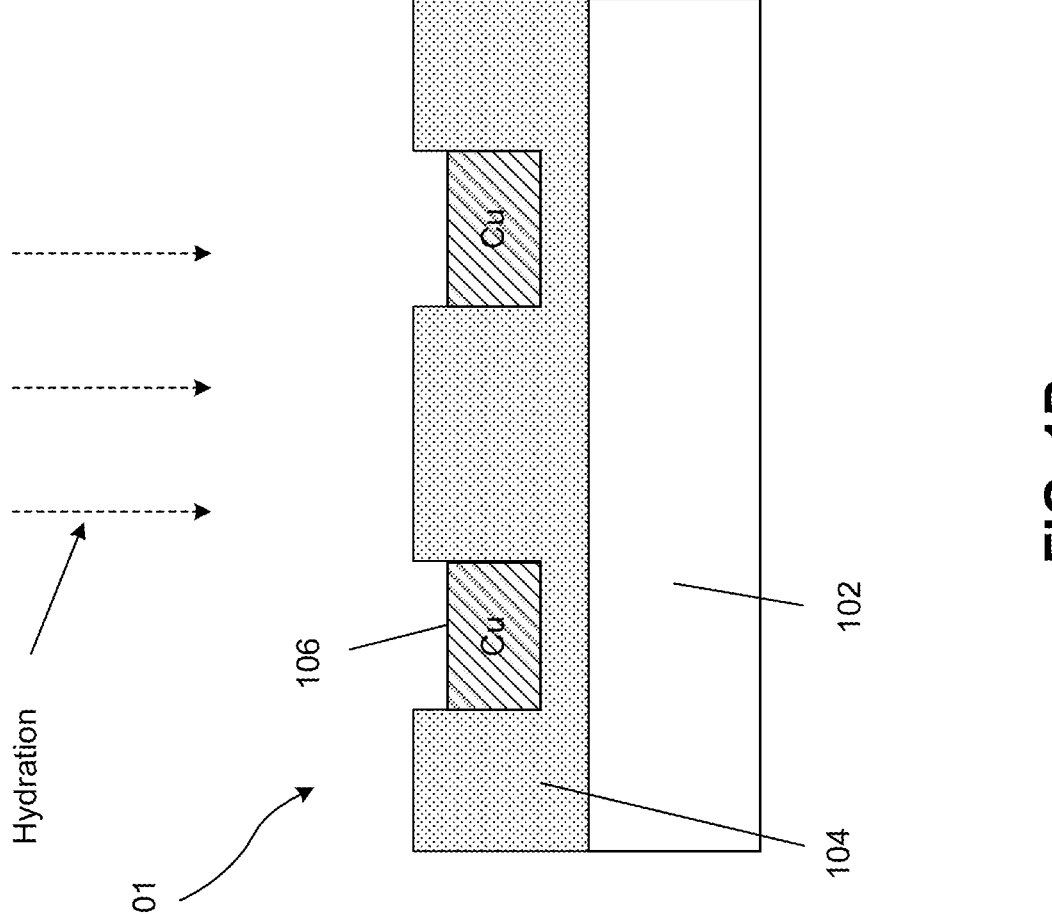
Figure 1C:
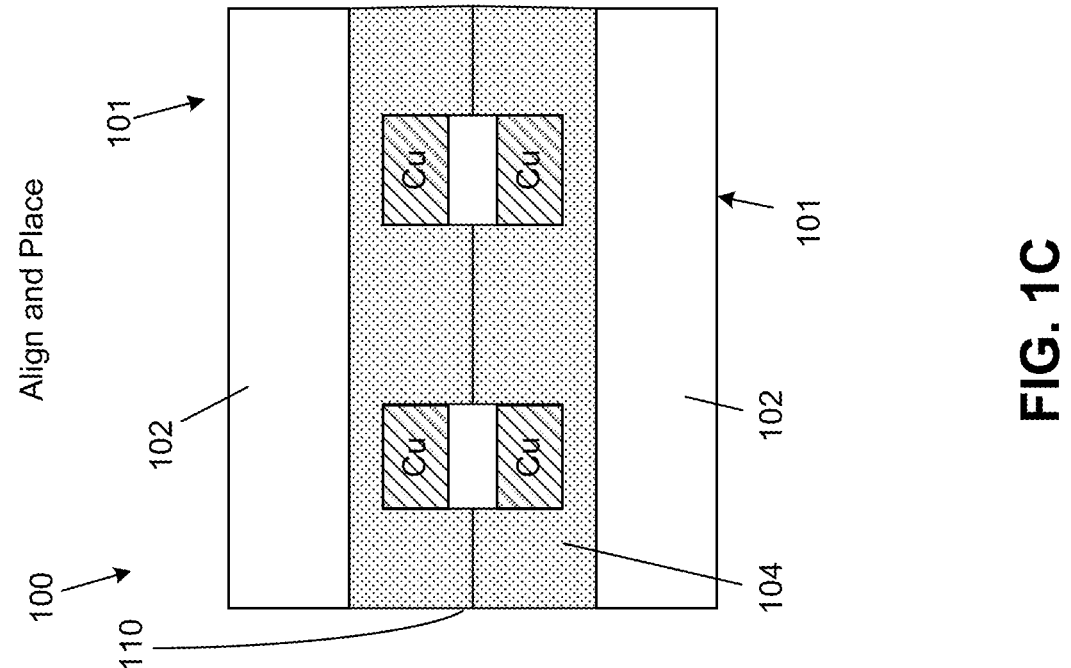
Figure 1D:
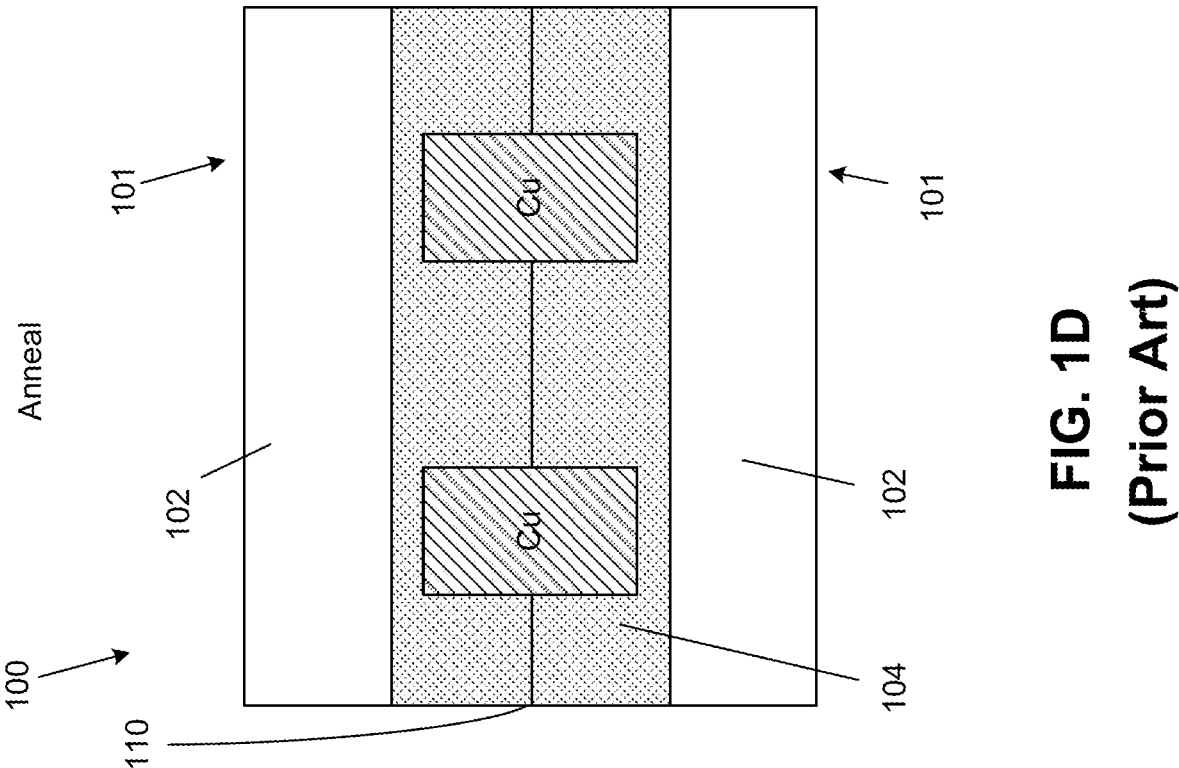

In the present implementations, the bonding process described in the method 70 does not include any surface treatment processes, such as the plasma treatment for activating the bonding surfaces 214/216 and the hydration process for enhancing the bonding capabilities of the bonding surfaces 214/216 as those depicted in FIGS. 1A and 1B, respectively. As will be described in detail below, the method 70 proceeds directly to applying a thermal treatment (e.g., an annealing process) or a light treatment (e.g., a UV treatment) to the coupled bonding surfaces 214/216, thereby curing or cross-linking the curable bonding layer 209 in one of the coupled bonding surfaces 214/216 to form non-reversible or harder-to-reverse covalent bonds with the curable bonding layer 209 (or with the dielectric layer 204) in the other one of the coupled bonding surfaces 214/216. In some examples, the non-reversible covalent bonds may conserve bonding sites at the bonding interface 302/304 due to reverse reaction losses.

Notably, omitting the surface treatment processes before aligning and contacting the bonding surfaces 214/216 reduces the number of modules (e.g., operations) performed on a bonding platform (e.g., reduces processing complexity, time, and/or cost) as well as the queue time requirement for fabrication. In existing implementations, the surface treatment processes generally result in reversible bonding between the bonding surfaces, which is relatively unstable and may pose processing constraints. Such processing constraints may include shortened processing time allowed between the surface treatment processes and the subsequent bonding processes, thereby imposing tighter queue time requirement. In contrast, curing or cross-linking the curable bonding layers 209 results in non-reversible covalent bonds with improved bonding strength across the bonding interface

302/304, thereby relaxing the queue time requirement that is otherwise present for bonding surfaces undergone surface treatment. In addition, incorporating the curable bonding layers 209 at the bonding surfaces 214/216 allows more stable functional groups to participate in the bonding process and improves properties including, for example, resistance to metal (e.g., Cu) diffusion, thermal stability at elevated temperatures, lower dielectric constant, hydrophobicity, mechanical strength (e.g., Young's modulus), and/or the like, of the semiconductor structure 300.

Figure 8B:
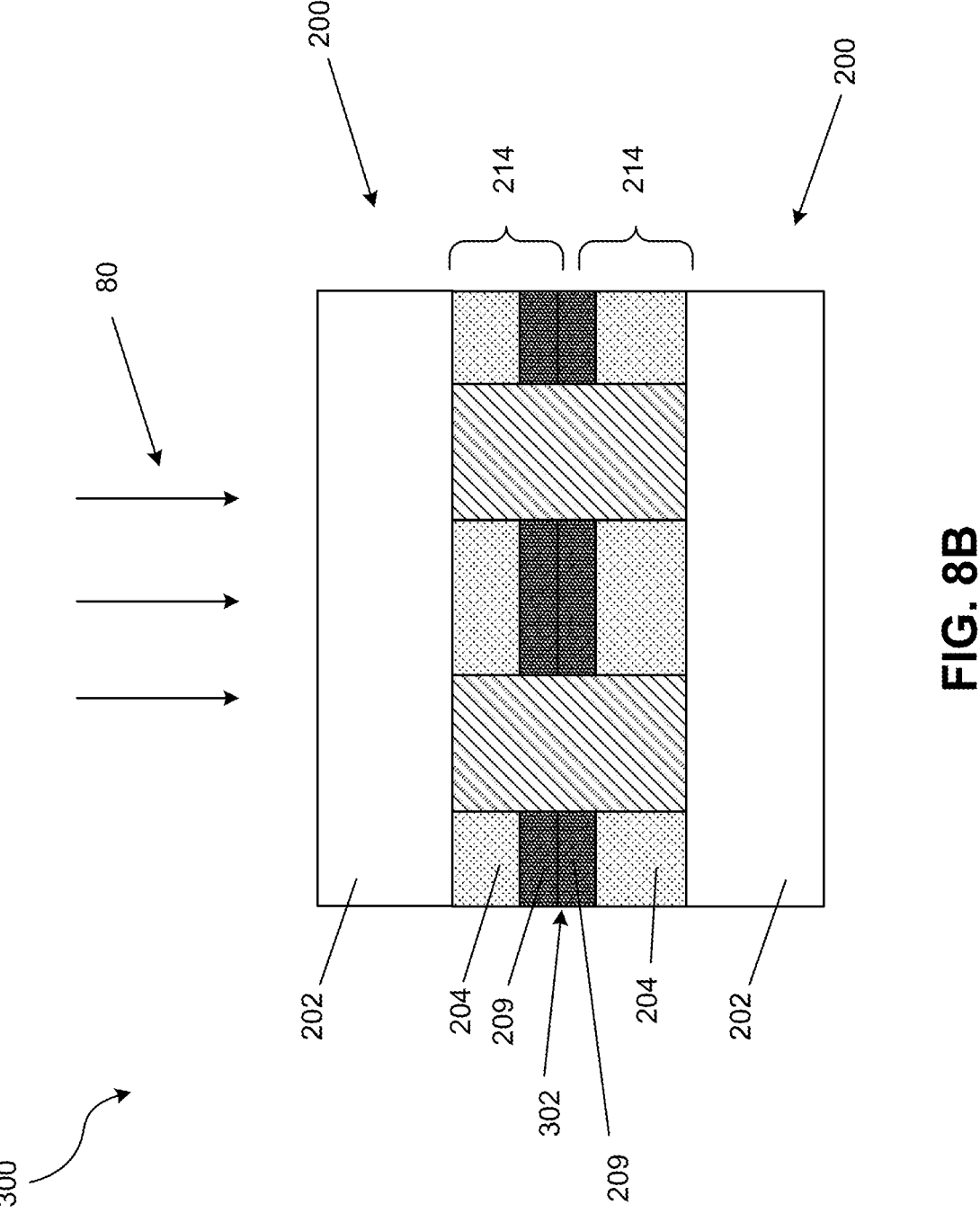
Figure 9B:
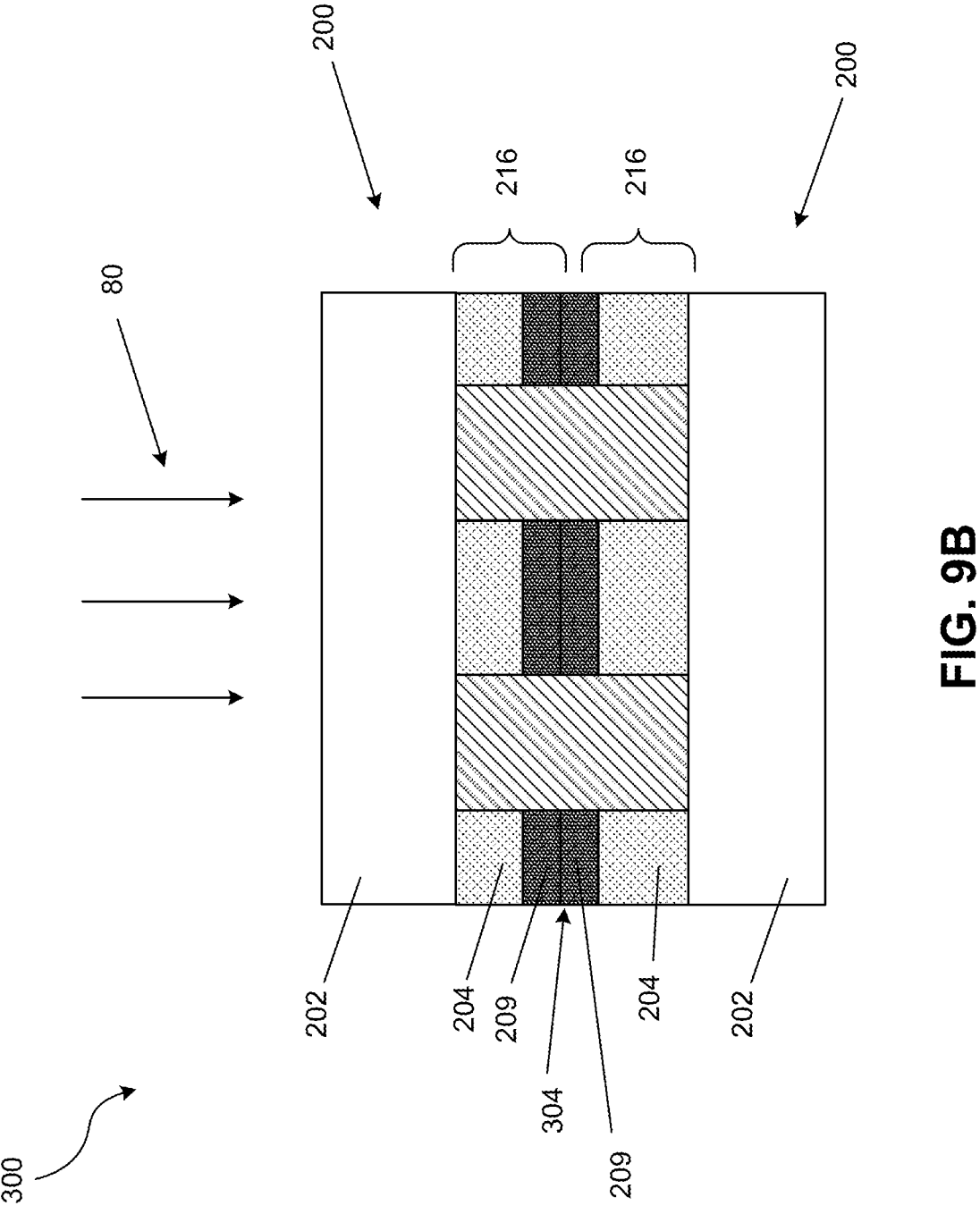

Referring to FIGS. 5, 8B, and 9B, the method 70 at operation 76a performs a thermal treatment (e.g., an annealing process) 80 to cure the opposing curable bonding layers 209 across the bonding interface 302/304, thereby fusing together the semiconductor structures 200. The thermal treatment 80 is implemented by applying thermal energy to the semiconductor structure 300. In the present implementations, the thermal energy cures or cross-links the precursor molecules 402 to form the polymer-based material 404 in the curable bonding layer 209, according to the schematic reaction 400 described above in reference to FIG. 10. As a result, the curable bonding layer 209 of one of the bonding surfaces 214/216 is covalently bonded to both the underlying dielectric layer 204 of the same bonding surface 214/216 and to the curable bonding layer 209 of the opposing bonding surface 214/216.

In addition, the thermal energy causes the opposing conductive features 206 to expand across the bonding interface 302/304, thereby forming the metal-to-metal contact. In this regard, the temperature of the thermal treatment 80 is configured to be at least the same as the temperature suitable for the thermal treatment 403 described above. For example, the thermal treatment 80 may be implemented at a temperature of at least about 250° C. In some implementations, the thermal treatment 80 is applied at about 200° C. to about 400° C. (e.g., at about 350° C.).

Figure 13A:
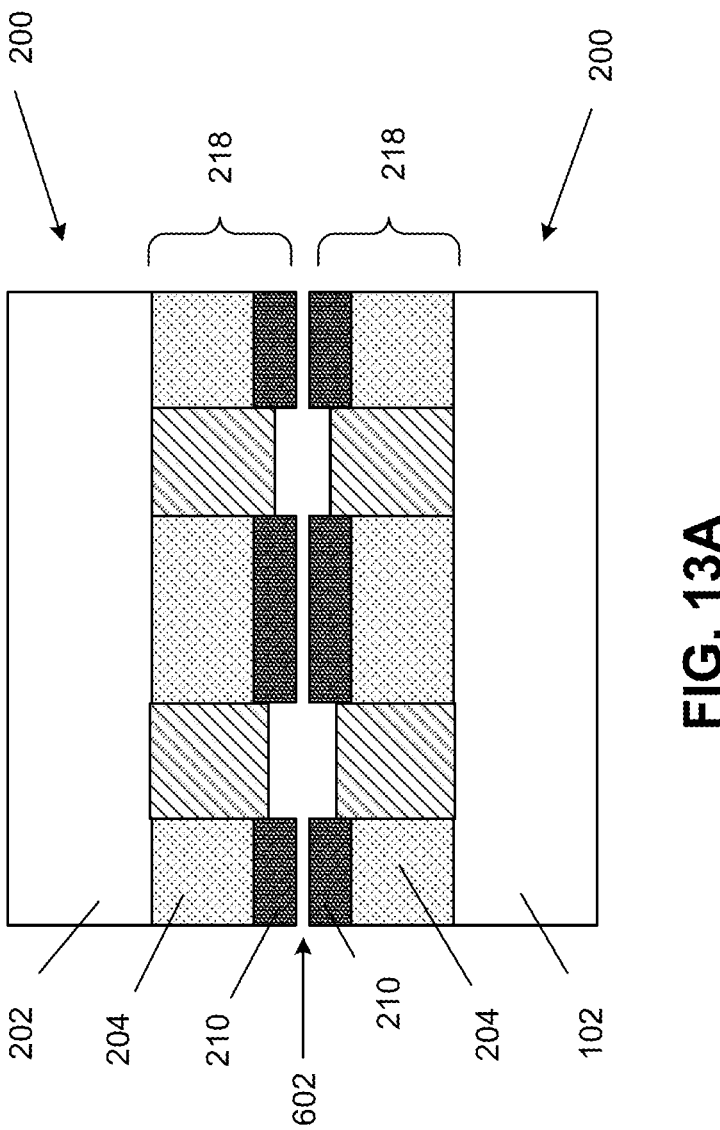
FIGS. 13A, 13B, and 13C each illustrate a cross-sectional side view of an example semiconductor structure at intermediate steps of the method illustrated in one or more of FIGS. 2, 3, 4, and 5, in accordance with some embodiments.
Figure 13B:
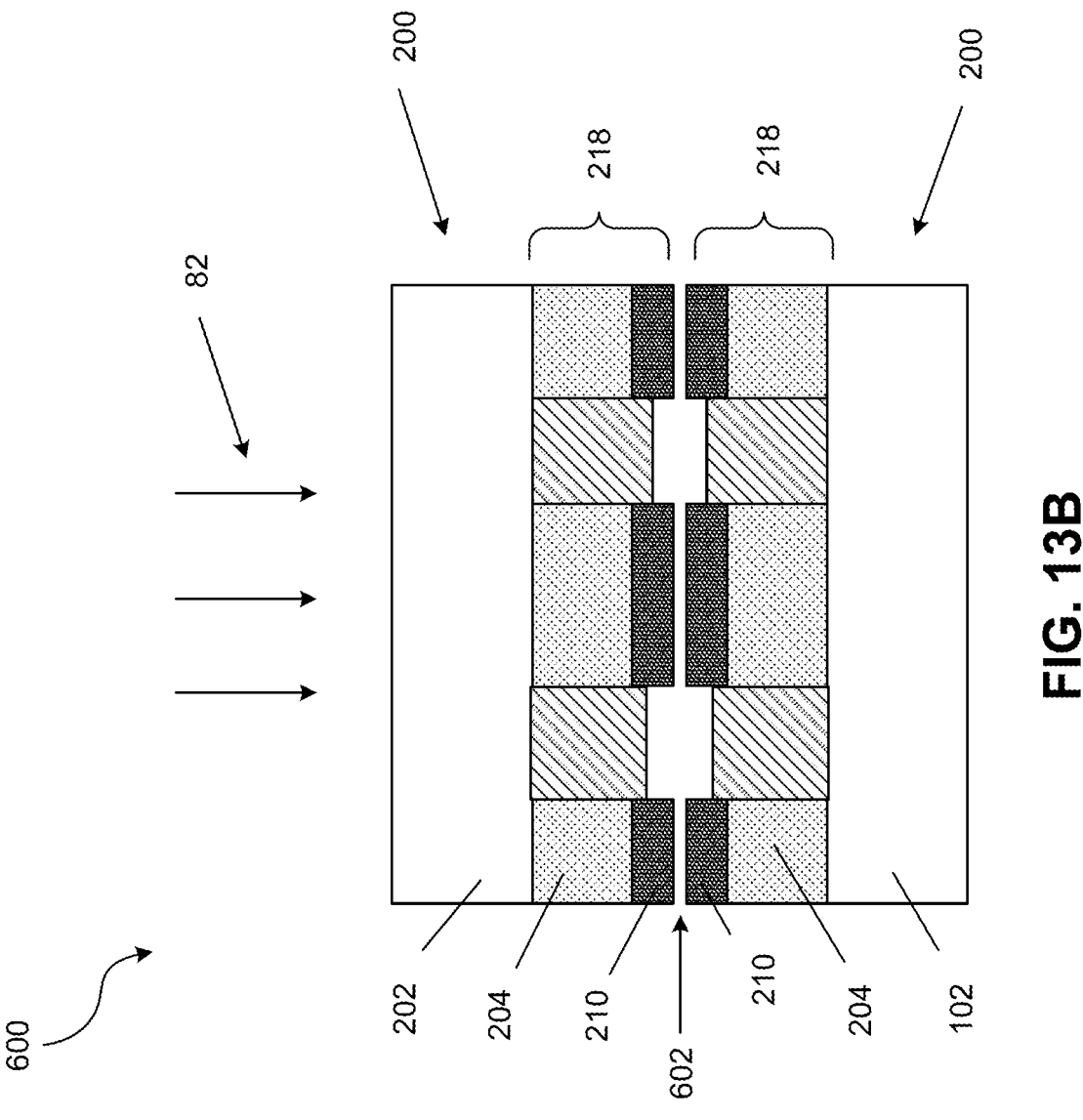
Figure 13C:
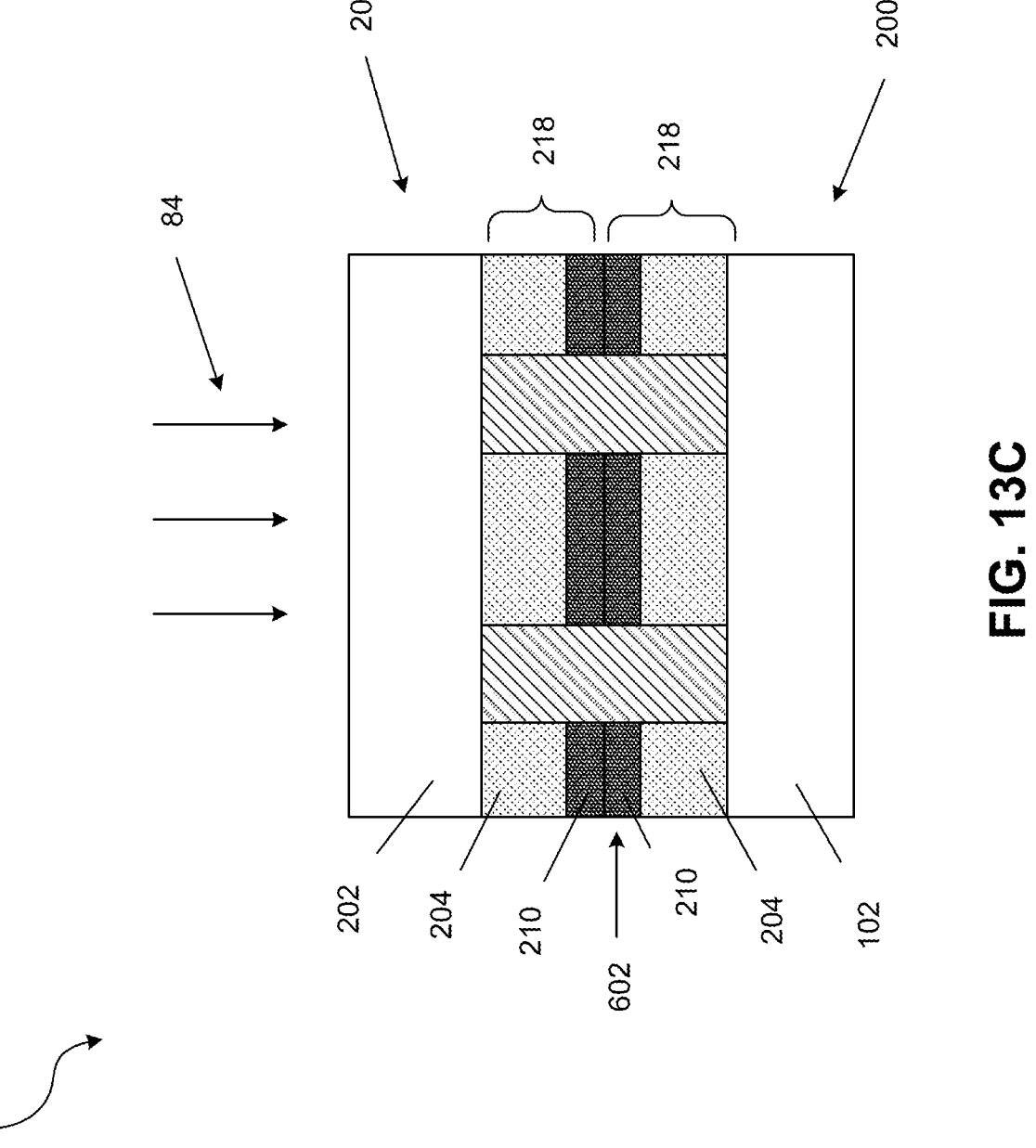

FIGS. 13A-13C collectively depicts an alternative implementation of the method 70 as shown in FIG. 5 during which a light (or UV) treatment 82, rather than the thermal treatment 80, is applied. In the present disclosure, FIG. 13A corresponds to FIGS. 8A and 9A and therefore depicts implementations similar to those associated with FIGS. 8A and 9A described in detail above.

Referring to FIG. 13A, the method 70 at operation 72 provides two semiconductor structures 200, at least one of which includes a bonding surface 218. In the present implementations, the bonding surface 218 includes the conductive feature 206 in the dielectric layer 204 and a curable bonding layer 210 over the dielectric layer 204, where the curable bonding layer 210 includes precursor molecules 408 different from the precursor molecules 402.

FIG. 11 depicts a schematic reaction 450 similar to the schematic reaction 400, with the exception that the schematic reaction 450 is activated by a light (e.g., UV) treatment 409. As shown, the schematic reaction 450 begins with the precursor molecule 408 similar to the precursor molecule 402. The precursor molecule 408 is a photocurable molecule and includes a Si-containing four-member ring structure, where each Si atom in the ring structure is coupled to the functional groups R3 and R4. In some implementations, if one or both of the functional groups R3 and R4 include an aryl group (e.g., an aromatic group), the precursor molecules 408 may undergo the ring-opening reaction when activated by the light treatment 409. In some examples, the aryl group may include a benzene ring. The precursor molecule 408 may include less or more suitable functional groups similar to the functional groups R3 and R4.

In some implementations, the light treatment 409 further polymerizes the activated precursor molecules 408 to form a polymer-based material 412 having the plurality (e.g., n>2) of the monomers 410 as shown. The polymer-based material 412 includes two or more carbosilane (—Si—C—Si—C—) bonds (e.g., forming polycarbosilanes) linked together, which may exhibit lower polarity and ceramic-like properties similar to those of the polymer-based material 404.

Referring to FIG. 12, column 502 of a table 500 provides non-limiting example precursor molecules 408 each having an aryl group (e.g., a benzene ring) 503 coupled to a four-member ring structure containing Si atoms. Column 504 lists wavelengths corresponding to each of the example precursor molecules 408 in the column 502, while column 506 provides molar attenuation coefficient (e.g., molar absorptivity) E corresponding to each of the example precursor molecules 408. In some examples, the molar attenuation coefficient E reflects the efficiency of the ring-opening reaction described above with respect to the schematic reaction 450 in FIG. 11.

The curable bonding layer 210 and the bonding surface 218 may be formed by a series of operations similar to those of the methods 10, 30, and/or 50 as described herein. Accordingly, in the present implementations, the curable bonding layer 210 includes the precursor molecules 408 configured to be subsequently cured or cross-linked according to the schematic reaction 450 to form the polymer-based material 412 in a cured bonding layer.

Subsequently, still referring to FIG. 13A, the method 70 at operation 74 aligns and bonds the two opposing bonding surfaces 218 of the respective semiconductor structures 200 to make physical and direct contact at a bonding interface 602, resulting in a semiconductor structure (e.g., bonded structure) 600.

Referring to FIG. 13B, the method 70 at operation 76b performs a light treatment (e.g., phototreatment, UV treatment) 82 to activate and subsequently cure the precursor molecules 408 of the bonded curable bonding layers 209 according to the schematic reaction 450 described above. In this regard, the light treatment 82 may be similar to the light treatment 409 described herein. In some implementations, the light treatment 82 is performed by applying light, such as UV radiation, at a shallow angle to the bonding surfaces 218. In some examples, the bonding surfaces 218 are exposed to UV radiation having a wavelength of about 210 nm to about 260 nm. Referring to FIG. 11, the applied radiation activates the ring-opening reactions of the precursor molecules 408 and subsequently cures or cross-links the activated precursor molecules 408 to form the polymer-based material 412 in the curable bonding layer 209. As a result, the curable bonding layer 209 of one of the bonding surfaces 218 is covalently bonded to both the underlying dielectric layer 204 of the same bonding surface 218 and to the curable bonding layer 209 of the opposing bonding surface 218 across the bonding interface 602.

In the present implementations, the resulting bonding interface 602 is similar to the bonding interface 302/304 in terms of structure and property as described in detail above. For example, the bonding interface 602 may comprise non-reversible covalent bonds with lowered polarity and improved properties including resistance to metal (e.g., Cu) diffusion, thermal stability at elevated temperatures, relatively lower dielectric constant, hydrophobicity, mechanical strength (e.g., Young's modulus), and/or the like.

Subsequently, referring to FIG. 13C, the method 70 at operation 78 performs a thermal treatment 84 to complete the hybrid bonding process by establishing the metal-to-metal contact between the opposing conductive features 206. In the present implementations, the thermal treatment 84 provides thermal energy at a suitable temperature to cause the conductive features 206 of the opposing bonding surfaces 218 to expand across the bonding interface 602, thereby completing the hybrid bonding process. In this regard, the thermal treatment may be implemented at a temperature similar to that of the thermal treatment 80, which is at least about 250° C. In some implementations, the thermal treatment 84 is applied at about 200° C. to about 400° C. (e.g., at about 350° C.). In some implementations, the light treatment 82 is applied immediately before or simultaneously with the thermal treatment 84 to avoid premature quenching of the activated precursor molecules 408 before the hybrid bonding process is completed.

In some implementations, the curable bonding layer 210 includes the precursor molecules 402 in addition to the precursor molecules 408 such that the curable bonding layer 210 can be cured or cross-linked by both a thermal treatment (e.g., the thermal treatment 80) and a light treatment (e.g., the light treatment 82) simultaneously or sequentially according to operations of the method 70 described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
providing a first bonding surface on a first substrate, the first bonding surface including a bonding layer that is thermally curable or photocurable;
providing a second bonding surface on a second substrate;
bonding the first substrate to the second substrate by making physical contact between the first bonding surface and the second bonding surface; and
applying thermal energy or light to the bonding layer,
wherein applying the thermal energy or the light covalently bonds the bonding layer to the first substrate at the first bonding surface and to the second substrate at the second bonding surface, respectively.

2. The method of claim 1, wherein the bonding layer is a first bonding layer, wherein the second bonding surface includes a second bonding layer that is thermally curable or photocurable.

3. The method of claim 1, wherein applying the light includes implementing UV radiation at a wavelength of 210 nm to 260 nm.

4. The method of claim 1, wherein applying the thermal energy includes heating the bonding layer at a temperature of at least 250° C.

5. The method of claim 1, wherein the bonding layer includes a precursor molecule having a silicon-containing ring structure.

6. The method of claim 5, wherein the bonding layer includes disilacyclobutanes (DSCB).

7. The method of claim 1, wherein the first substrate includes a conductive feature disposed in a dielectric layer, and wherein providing the first bonding surface includes:
depositing a bonding layer over the first substrate; and
removing a portion of the bonding layer to expose the conductive feature such that the first bonding surface includes the conductive feature and a remaining portion of the bonding layer.

8. The method of claim 7, further comprising recessing a top portion of the conductive feature such that the bonding layer protrudes from the recessed conductive feature, wherein applying the thermal energy causes the recessed conductive feature to expand toward the second bonding surface.

9. A method, comprising:
providing a first bonding surface on a first substrate, the first bonding surface including a first bonding layer that is thermally curable or photocurable;
providing a second bonding surface on a second substrate, the second bonding surface including a second bonding layer;
bonding the first substrate to the second substrate by making physical contact between the first bonding layer and the second bonding layer; and
applying thermal energy or light to the first bonding layer and the second bonding layer.

10. The method of claim 9, wherein the second bonding layer is thermally curable or photocurable.

11. The method of claim 9, wherein the first bonding layer is thermally curable, and wherein applying the thermal energy is implemented at a temperature at least 250° C.

12. The method of claim 9, wherein the first bonding layer is photocurable, the method further comprising performing an annealing process after applying the light.

13. The method of claim 12, wherein applying the light includes implementing UV radiation at a wavelength of 210 nm to 260 nm.

14. The method of claim 9, wherein applying the thermal energy or the light includes:
forming first covalent bonds at a first interface between the first bonding layer and the first substrate;
forming second covalent bonds at a second interface between the second bonding layer and the second substrate; and
forming third covalent bonds at a third interface between the first bonding layer and the second bonding layer.

15. The method of claim 14, wherein at least one of the first, the second, and the third covalent bonds include a carbosilane linkage.

16. The method of claim 9, wherein the first bonding layer includes a precursor molecule having a silicon-containing ring structure.

17. The method of claim 16, wherein the silicon-containing ring structure is coupled to an aryl group.

18. A semiconductor structure, comprising:
a first substrate;
a second substrate; and
a bonding layer bonding the first substrate to the second substrate, the bonding layer including a polymer-based material that includes carbosilane linkages.

19. The semiconductor structure of claim 18, wherein the bonding layer includes disilacyclobutanes (DSCB).

* * * * *